United States Patent
Sugiyama

(10) Patent No.: US 8,978,217 B2
(45) Date of Patent: Mar. 17, 2015

(54) MANUFACTURING METHOD OF PACKAGE

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 351 days.

(21) Appl. No.: 13/429,855

(22) Filed: Mar. 26, 2012

(65) Prior Publication Data

US 2012/0249254 A1 Oct. 4, 2012

(30) Foreign Application Priority Data

Mar. 28, 2011 (JP) .................................. 2011-070536

(51) Int. Cl.
*H01L 41/22* (2013.01)
*H04R 17/00* (2006.01)
*H05K 3/36* (2006.01)
*H05K 3/20* (2006.01)
*H03H 3/02* (2006.01)
*H03H 9/02* (2006.01)

(52) U.S. Cl.
CPC .. *H03H 3/02* (2013.01); *H03H 9/02* (2013.01)
USPC ............................. 29/25.35; 29/830; 29/831

(58) Field of Classification Search
CPC ..................... H01L 41/39; H01L 2924/01078; H05K 2201/0355
USPC ......................................... 29/25.35, 830, 831
See application file for complete search history.

(56) References Cited

U.S. PATENT DOCUMENTS

| | | | | |
|---|---|---|---|---|
| 3,417,459 A | * | 12/1968 | Pomerantz et al. | 156/273.1 |
| 4,666,551 A | * | 5/1987 | Soberay et al. | 156/382 |
| 4,857,135 A | * | 8/1989 | Copp | 156/580 |
| 5,235,238 A | * | 8/1993 | Nomura et al. | 310/349 |
| 5,607,236 A | * | 3/1997 | Takagi et al. | 374/117 |
| 6,337,470 B1 | * | 1/2002 | Von Arx et al. | 219/544 |
| 6,537,938 B1 | * | 3/2003 | Miyazaki | 501/66 |
| 7,205,625 B2 | * | 4/2007 | Nakamura et al. | 257/459 |
| 7,294,951 B2 | * | 11/2007 | Oouchi et al. | 310/348 |
| 2003/0168145 A1 | * | 9/2003 | Suga et al. | 156/60 |
| 2003/0205333 A1 | * | 11/2003 | Hayafuji et al. | 156/580 |
| 2004/0201650 A1 | * | 10/2004 | Higuchi et al. | 347/71 |
| 2005/0104480 A1 | * | 5/2005 | Tanaya | 310/344 |
| 2007/0075796 A1 | * | 4/2007 | Mizumura et al. | 331/158 |
| 2007/0111471 A1 | * | 5/2007 | Okada | 438/455 |
| 2007/0120614 A1 | * | 5/2007 | Moriya et al. | 331/158 |
| 2007/0126316 A1 | * | 6/2007 | Usuda et al. | 310/348 |
| 2007/0187394 A1 | * | 8/2007 | Taniguchi | 219/639 |
| 2008/0129149 A1 | * | 6/2008 | Numata et al. | 310/328 |
| 2008/0164606 A1 | * | 7/2008 | Greisen et al. | 257/726 |
| 2008/0210383 A1 | * | 9/2008 | Hirata | 156/498 |

(Continued)

FOREIGN PATENT DOCUMENTS

JP 2006-339896 A 12/2006

*Primary Examiner* — David Angwin
(74) *Attorney, Agent, or Firm* — Brinks Gilson & Lione

(57) ABSTRACT

A package manufacturing method where a base substrate and a lid substrate, at least one having a through-hole, are anodically bonded to each other using a jig having a communication-hole and arranged in a vacuum chamber to laminate the lid substrate to the base substrate and thereby form a bonded body having a plurality of cavities, each of which includes an electronic part sealed therein. The through-hole and the communication-hole are aligned with each other inside the vacuum chamber, such that gas within the cavities can escape through the through-hole and the communication-hole during bonding. A plurality of packages are formed by cutting the bonded body for every one of the plurality of cavities.

12 Claims, 16 Drawing Sheets

(56) References Cited

U.S. PATENT DOCUMENTS

| | | | |
|---|---|---|---|
| 2011/0284148 A1* | 11/2011 | Kawada | 156/64 |
| 2012/0206998 A1* | 8/2012 | Numata et al. | 368/47 |
| 2012/0217638 A1* | 8/2012 | Tanaka et al. | 257/741 |
| 2012/0243384 A1* | 9/2012 | Funabiki | 368/47 |

* cited by examiner

MANUFACTURING METHOD OF PACKAGE

RELATED APPLICATIONS

This application claims priority under 35 U.S.C. §119 to Japanese Patent Application No. 2011-070536 filed on Mar. 28, 2011, the entire content of which is hereby incorporated by reference.

BACKGROUND OF THE INVENTION

1. Field of the Invention

The present invention relates to a manufacturing method of a package which can seal an electronic part in a cavity.

2. Description of the Related Art

Recently, a package product having the following constitution has been popularly used. The package product includes a base substrate and a lid substrate which are bonded to each other by anodic bonding in a laminated state so as to form a cavity therebetween, and an operating piece which is mounted on a portion of the base substrate positioned inside the cavity.

As this type of package product, for example, there has been known a piezoelectric vibrator which is mounted on a mobile phone or a personal digital assist and makes use of crystal or the like as a time source, a timing source for a control signal or the like, a reference signal source or the like.

Also, there has been known a method where such a package product is formed as follows (see JP-A-2006-339896).

Firstly, a base substrate forming wafer and a lid substrate forming wafer are set in an anodic bonding device arranged in a vacuum chamber, and these base substrate forming wafer and lid substrate forming wafer are overlapped to each other by way of a bonding film for anodic bonding which is made of a conductive material.

On a bonding surface of the lid substrate forming wafer, a plurality of recessed portions which form cavities when the lid substrate forming wafer overlaps the base substrate forming wafer are formed.

On a bonding surface of the base substrate forming wafer, a plurality of operating pieces are mounted corresponding to the plurality of recessed portions formed on the lid substrate forming wafer, and a bonding film is formed on a portion of the bonding surface except for portions where the operating pieces are mounted.

Then, the lid substrate forming wafer is set on an electrode plate of the anodic bonding device.

Next, while activating ions in the lid substrate forming wafer by heating the lid substrate forming wafer, a voltage is applied between the bonding film of the base substrate forming wafer and the electrode plate thus supplying an electric current to the lid substrate forming wafer.

Accordingly, an electrochemical reaction is generated on an interface between the bonding film and a bonding surface of the lid substrate forming wafer so that the bonding film of the base substrate forming wafer and the lid substrate forming wafer are bonded to each other by anodic bonding thus forming a wafer bonded body.

Thereafter, a plurality of package products are formed by cutting the wafer bonded body at predetermined positions.

SUMMARY OF THE INVENTION

However, the above-mentioned method relating to the prior art has a tendency that, at the time of anodic bonding, with respect to the base substrate forming wafer and the lid substrate forming wafer (both wafers), outer peripheral portions of these wafers are bonded earlier than center portions of these wafers in a cavity or in a product region where operating pieces are arranged.

Along with such a tendency, for example, there may be a case where strain or warping occurs at the center portions so that a gas which is generated between both wafers at the time of bonding is liable to stay between the center portions.

In such a case, the degree of vacuum in the cavity of the acquired package product is lowered through the center portions and hence, there is a possibility that a package product which does not have the desired performance is produced.

The present invention has been made in view of the above-mentioned circumstances, and it is an object of the present invention to provide a manufacturing method of a package, a piezoelectric vibrator, an oscillator, an electronic apparatus and a radio-controlled timepiece where a gas generated between two wafers (a base substrate forming wafer and a lid substrate forming wafer) at the time of bonding these wafers to each other can be easily discharged to the outside.

To achieve the above-mentioned object by overcoming the above-mentioned object, according to one aspect of the present invention, there is provided a manufacturing method of a package including the steps of: forming a plurality of cavities each of which seals an electronic part (a piezoelectric vibrating piece 4 in an embodiment described later, for example) between a base substrate (a base substrate forming wafer 40 in the embodiment described later, for example) and a lid substrate (a lid substrate forming wafer 50 in the embodiment described later, for example) by laminating the base substrate and the lid substrate to each other by sandwiching from both sides in the laminating direction using a jig (a lower jig 31 and upper jig 33 in the embodiment described later, for example) arranged inside a vacuum chamber (a vacuum chamber 61 in the embodiment described later, for example); forming a bonded body (a wafer bonded body 60 in the embodiment described later, for example) by bonding the base substrate and the lid substrate to each other by anodic bonding in a state where the base substrate and the lid substrate are pressurized in the laminating direction; and forming a plurality of packages by cutting the bonded body for every one of plurality of cavities, wherein at least the base substrate or the lid substrate has a through hole (through hole 21 in the embodiment described later, for example) which penetrates the base substrate or the lid substrate in the laminating direction, a communication hole (communication hole 31a in the embodiment described later, for example) which makes the through hole and the inside of the vacuum chamber communicate with each other is formed in the jig, and the base substrate and the lid substrate are laminated to each other in a state where the through hole and the communication hole are made to communicate with each other at the time of forming the bonded body by the anodic bonding.

According to the manufacturing method of the present invention, the communication holes which make the through hole which is formed at least in the base substrate or in the lid substrate and the vacuum chamber communicate with each other are formed in the jig which laminates the base substrate and the lid substrate by sandwiching from both sides in the laminating direction.

Accordingly, a gas generated between the base substrate and the lid substrate at the time of bonding the base substrate and the lid substrate can be easily discharged to the inside of the vacuum chamber from between the base substrate and the lid substrate through the through hole and the communication hole whereby a plurality of packages which ensure the desired degree of vacuum in the cavity can be easily manufactured.

DETAILED DESCRIPTION OF THE PREFERRED EMBODIMENTS

Hereinafter, the explanation is made with respect to a manufacturing method of a package, a piezoelectric vibrator which includes a package manufactured by the manufacturing method of a package, and an oscillator, an electronic apparatus and a radio-controlled timepiece which respectively include the piezoelectric vibrator according to one embodiment of the present invention.

In this embodiment, the explanation is made by taking a piezoelectric vibrator as a package which includes a base substrate and a lid substrate which are bonded to each other by anodic bonding in a laminated state so as to form a cavity therebetween, and an operating piece which is mounted on a portion of the base substrate positioned inside the cavity as an example.

The piezoelectric vibrator 1 is, as shown in FIG. 1 to FIG. 5, for example, a surface-package-type piezoelectric vibrator where the piezoelectric vibrator 1 is formed into a box shape by laminating the base substrate 2 and the lid substrate 3 in two layers, and a piezoelectric vibrating piece (operating piece) 4 is housed in a cavity C formed in the piezoelectric vibrator 1.

Figure 5:
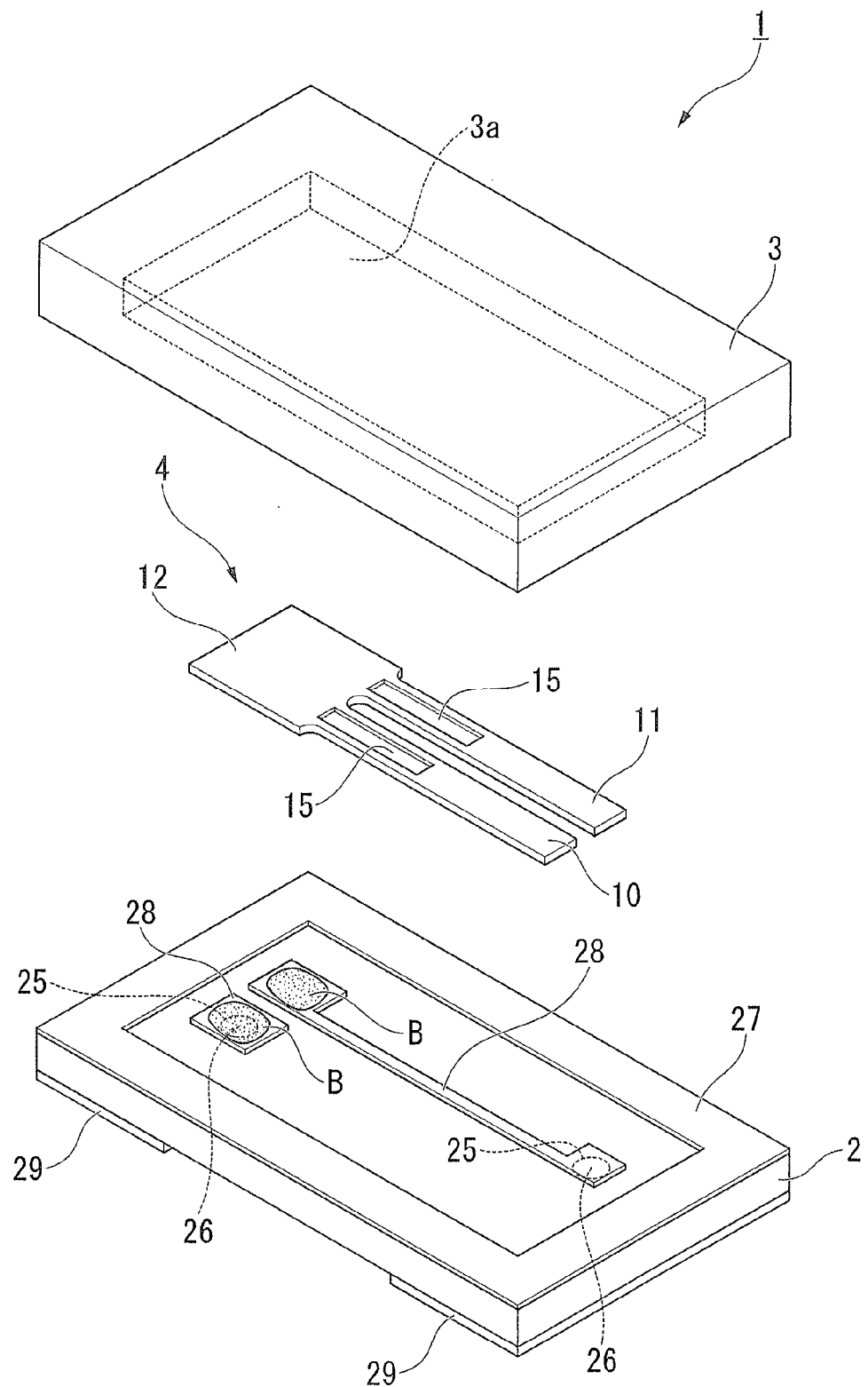
FIG. 5 is an exploded perspective view of the piezoelectric vibrator shown in FIG. 1.

In FIG. 5, to facilitate the understanding of drawings, excitation electrodes 13, lead electrodes 16, mount electrodes 14 and weight metal films 17 described later are omitted from the drawings.

Figure 6:
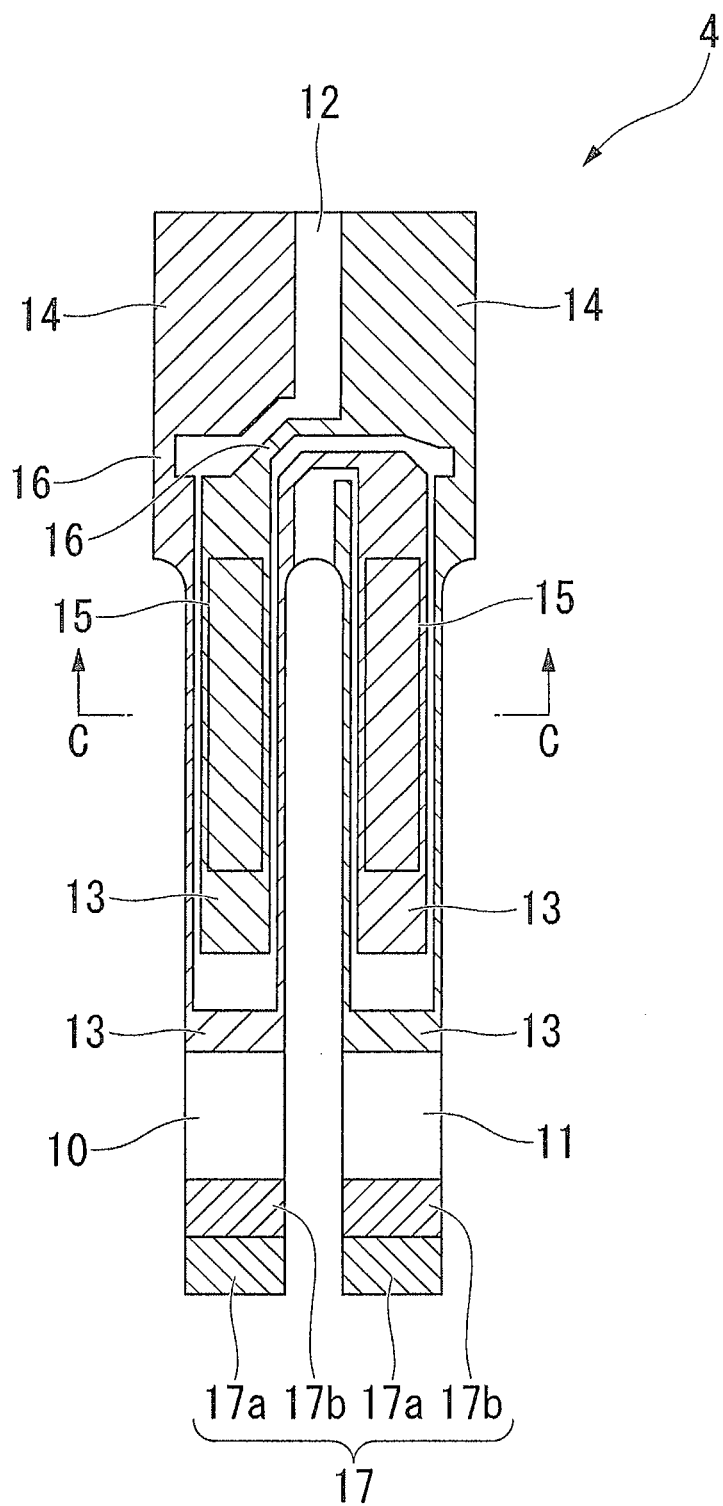
FIG. 6 is a top plan view of the piezoelectric vibrating piece which constitutes the piezoelectric vibrator shown in FIG. 1.
Figure 7:
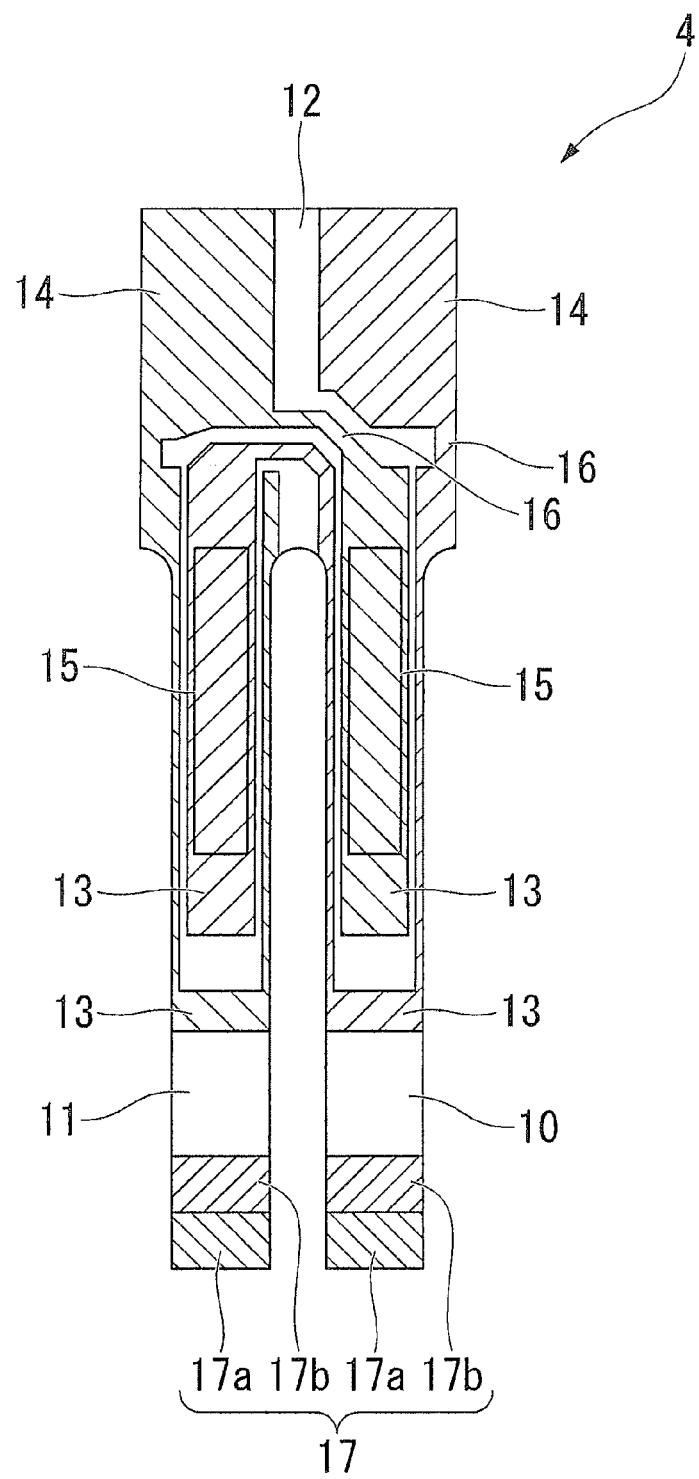
FIG. 7 is a bottom plan view of the piezoelectric vibrating piece shown in FIG. 5.
Figure 8:
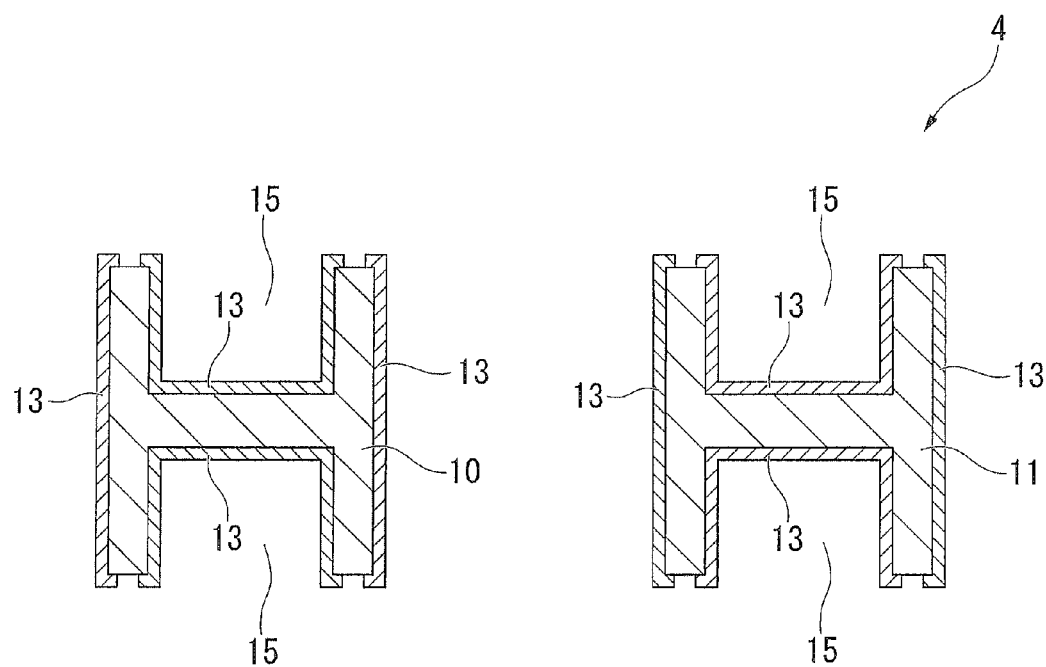
FIG. 8 is a cross-sectional view as viewed in the direction indicated by an arrow C-C in FIG. 6.

As shown in FIG. 6 to FIG. 8, the piezoelectric vibrating piece 4 is a tuning-fork-type vibrating piece which is made of a piezoelectric material such as crystal, lithium tantalate or lithium niobate, and the piezoelectric vibrating piece 4 is vibrated when a predetermined voltage is applied to the piezoelectric vibrating piece 4.

The piezoelectric vibrating piece 4 includes a pair of vibrating arm portions 10, 11 which is arranged parallel to each other, a base portion 12 to which proximal end sides of the pair of vibrating arm portions 10, 11 are integrally fixed, the excitation electrodes 13 which are formed on outer surfaces of the pair of vibrating arm portions 10, 11 so as to vibrate the pair of vibrating arm portions 10, 11, and the mount electrodes 14 which are electrically connected to the excitation electrodes 13.

Further, the piezoelectric vibrating piece 4 of this embodiment includes groove portions 15 which are formed on both main surfaces of the pair of vibrating arm portions 10, 11 respectively along the longitudinal direction of the vibrating arm portions 10, 11. The groove portion 15 extends from a proximal end side to an area in the vicinity of an intermediate portion of the vibrating arm portions 10, 11.

The excitation electrodes 13 are electrodes for vibrating the pair of vibrating arm portions 10, 11 in the direction that the pair of vibrating arm portions 10, 11 approaches to each other or is separated from each other with predetermined resonance frequency, and are formed on outer surfaces of the pair of vibrating arm portions 10, 11 by patterning in a state where the excitation electrodes 13 are electrically separated from each other.

To be more specific, as shown in FIG. 8, one excitation electrode 13 is mainly formed on the groove portions 15 of one vibrating arm portion 10 and on both side surfaces of the other vibrating arm portion 11, while the other excitation electrode 13 is mainly formed on both side surfaces of one vibrating arm portion 10 and on the groove portions 15 of the other vibrating arm portion 11.

Further, as shown in FIG. 6 and FIG. 7, the excitation electrodes 13 are electrically connected to the mount electrodes 14 through the lead electrodes 16 respectively on both main surfaces of the base portion 12. A voltage is applied to the piezoelectric vibrating piece 4 through the mount electrodes 14. Here, the above-mentioned excitation electrodes 13, the mount electrodes 14 and the lead electrodes 16 are respectively films formed of a conductive film made of chromium (Cr), nickel (Ni), aluminum (Al), titanium (Ti) or the like by coating, for example.

A weight metal film 17 is formed on distal ends of the pair of vibrating arm portions 10, 11 by coating. The weight metal film 17 is provided for performing the adjustment (frequency adjustment) such that the pair of vibrating arm portions 10, 11 per se is vibrated in a vibration state within a predetermined frequency range.

Here, the weight metal film 17 is constituted of a coarse adjustment film 17a which is used for coarsely adjusting the frequency and a fine adjustment film 17b which is used for finely adjusting the frequency.

By performing the frequency adjustment using these coarse adjustment films 17a and the fine adjustment films 17b, it is possible to make the frequency of the pair of vibrating arm portions 10, 11 fall within a range of nominal frequency of the device.

Figure 2:
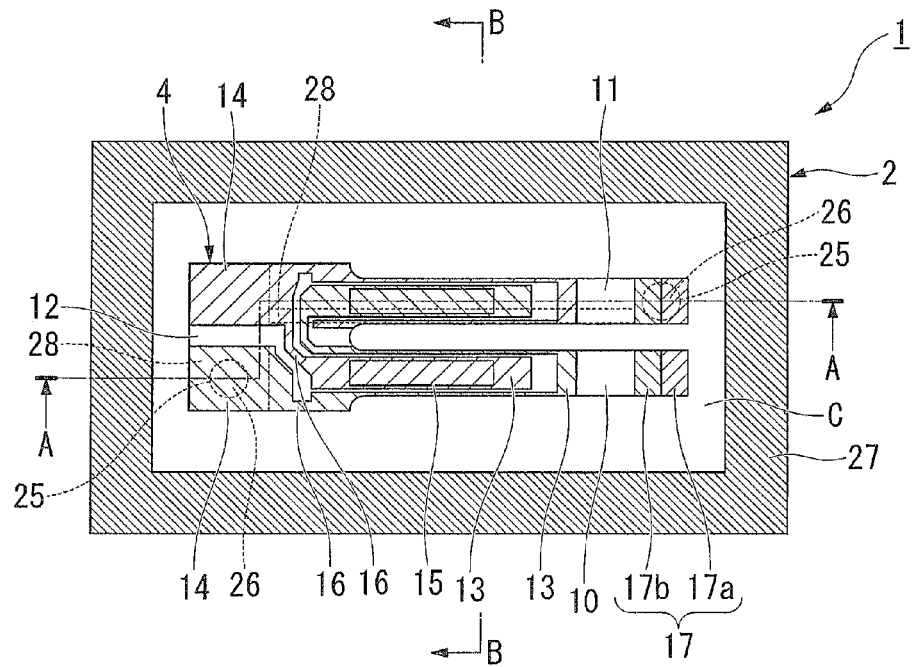
FIG. 2 is a view showing the internal constitution of the piezoelectric vibrator shown in FIG. 1, and is also a view showing a piezoelectric vibrating piece as viewed from above in a state where a lid substrate is removed.
Figure 3:
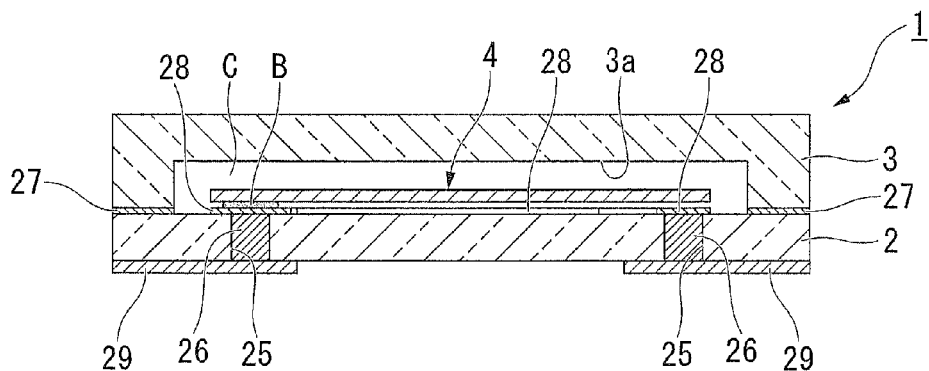
FIG. 3 is a cross-sectional view of the piezoelectric vibrator taken along a line A-A in FIG. 2.
Figure 4:
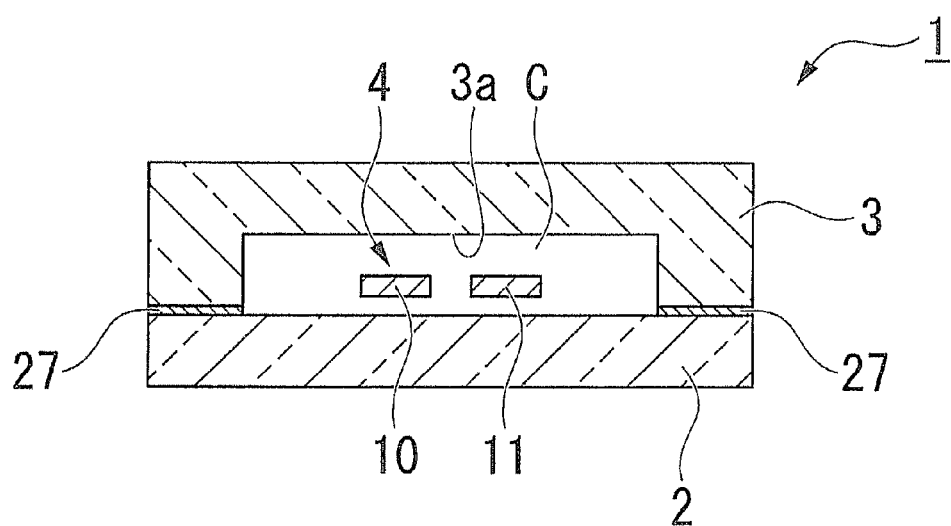
FIG. 4 is a cross-sectional view of the piezoelectric vibrator taken along a line B-B in FIG. 2.

As shown in FIG. 2, FIG. 3 and FIG. 5, the piezoelectric vibrating piece 4 having such a constitution is bonded to an upper surface of the base substrate 2 by bump bonding using a bump B made of gold or the like.

To be more specific, the piezoelectric vibrating piece 4 is bonded to the base substrate 2 in a state where a pair of mount electrodes 14 is bonded to two bumps B which are formed on routing electrodes 28 described later by bump bonding in a contact state.

Due to such a constitution, the piezoelectric vibrating piece 4 is supported in a state where the piezoelectric vibrating piece 4 floats from the upper surface of the base substrate 2 and, at the same time, the mount electrodes 14 and the routing electrodes 28 are respectively electrically connected to each other.

The above-mentioned lid substrate 3 is a transparent insulation substrate made of a glass material such as soda-lime glass, for example, and has a plate shape as shown in FIG. 1, FIG. 3, FIG. 4 and FIG. 5.

A recessed portion 3a having a rectangular shape as viewed in a plan view in which the piezoelectric vibrating piece 4 is housed is formed on a bonding surface of the lid substrate 3 to which the base substrate 2 is bonded.

The recessed portion 3a forms the cavity C in which the piezoelectric vibrating piece 4 is housed when both substrates 2, 3 are made to overlap with each other.

Further, the recessed portion 3a is closed by the base substrate 2 due to the anodic bonding of the lid substrate 3 and the base substrate 2.

The base substrate 2 is, in the same manner as the lid substrate 3, a transparent insulation substrate made of a glass material such as soda-lime glass, for example, and as shown in FIG. 1 to FIG. 5, has a plate shape with a size which allows the base substrate 2 to overlap the lid substrate 3.

A pair of through holes 25 which penetrates the base substrate 2 is formed in the base substrate 2.

The pair of through holes 25 is formed such that the pair of through holes 25 is arranged within the cavity C.

To explain the structure in more detail, the through holes 25 are formed such that one through hole 25 is positioned on a base portion 12 side of the mounted piezoelectric vibrating piece 4, and the other through hole 25 is positioned on a distal end side of the vibrating arm portions 10, 11.

In the example shown in the drawing, the explanation is made by taking the through hole 25 which has the substantially same inner diameter over the whole region in the plate thickness direction of the base substrate 2 as an example. However, the present invention is not limited to such a constitution and, for example, the through hole may be formed into a tapered shape whose inner diameter is gradually narrowed or expanded along the plate thickness direction or other shapes.

In any case, it is sufficient that the through holes 25 penetrate the base substrate 2.

Further, a through electrode 26 is embedded in the pair of through holes 25 respectively.

These through electrodes 26 maintain the air-tightness in the cavity C by completely occupying the through holes 25, and each through electrode 26 makes an external electrode 29 described later and the routing electrode 28 conductive with each other.

A bonding film 27 for anodic bonding and the pair of routing electrodes 28 are formed by patterning on a bonding surface of the base substrate 2 to which the lid substrate 3 is bonded using a conductive material such as aluminum, for example.

The bonding film 27 is arranged over the substantially whole region of a portion of the bonding surface of the lid substrate 3 where the recessed portion 3a is not formed so as to surround the periphery of the recessed portion 3a.

Further, the pair of routing electrodes 28 is formed by patterning so as to electrically connect one through electrode 26 out of the pair of through electrodes 26 and one mount electrode 14 of the piezoelectric vibrating piece 4 to each other and to electrically connect the other through electrode 26 and the other mount electrode 14 of the piezoelectric vibrating piece 4 to each other.

To explain such a constitution in more detail, as shown in FIG. 2 and FIG. 5, one routing electrode 28 is formed right above one through electrode 26 so as to be positioned right below the base portion 12 of the piezoelectric vibrating piece 4.

The other routing electrode 28 is formed such that the other routing electrode 28 is routed from a position close to one routing electrode 28 to a distal end side of the vibrating arm portion 11 along the vibrating arm portion 11 and, thereafter, is positioned right above the other through electrode 26.

The bumps B are formed on the pair of routing electrodes 28 respectively, and the piezoelectric vibrating piece 4 is mounted on the base substrate 3 by making use of the bumps B.

Due to such a constitution, one mount electrode 14 of the piezoelectric vibrating piece 4 is made conductive with one through electrode 26 via one routing electrode 28, and the other mount electrode 14 is made conductive with the other through electrode 26 via the other routing electrode 28.

Figure 1:
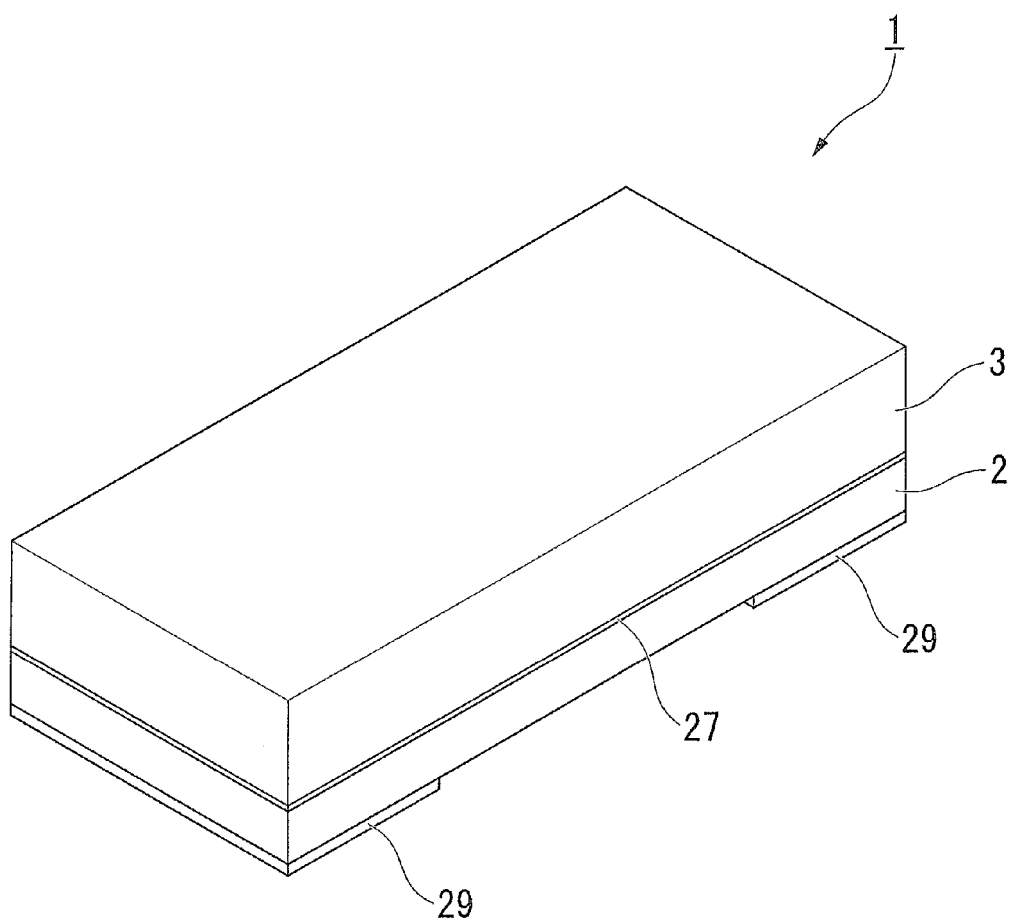
FIG. 1 is a perspective view showing the appearance of a piezoelectric vibrator according to an embodiment of the present invention.

On a surface of the base substrate 2 on a side opposite to the bonding surface of the base substrate 2, as shown in FIG. 1, FIG. 3 and FIG. 5, the external electrodes 29 which are electrically connected to the pair of through electrodes 26 respectively are formed.

That is, one external electrode 29 is electrically connected to one excitation electrode 13 of the piezoelectric vibrating piece 4 via one through electrode 26 and one routing electrode 28.

On the other hand, the other external electrode 29 is electrically connected to the other excitation electrode 13 of the piezoelectric vibrating piece 4 via the other through electrode 26 and the other routing electrode 28.

In operating the piezoelectric vibrator 1 having such a constitution, a predetermined drive voltage is applied to the external electrodes 29 formed on the base substrate 2.

Due to such applying of the drive voltage, an electric current flows in the excitation electrodes 13 of the piezoelectric vibrating piece 4 so that the pair of vibrating arm portions 10, 11 can be vibrated at predetermined frequency in the direction that the vibrating arm portions 10, 11 approach to each other or are separated from each other.

By making use of the vibrations of the pair of vibrating arm portions 10, 11, the piezoelectric vibrator 1 can be used as a time source, a timing source of a control signal, a reference signal source or the like.

Figure 9:
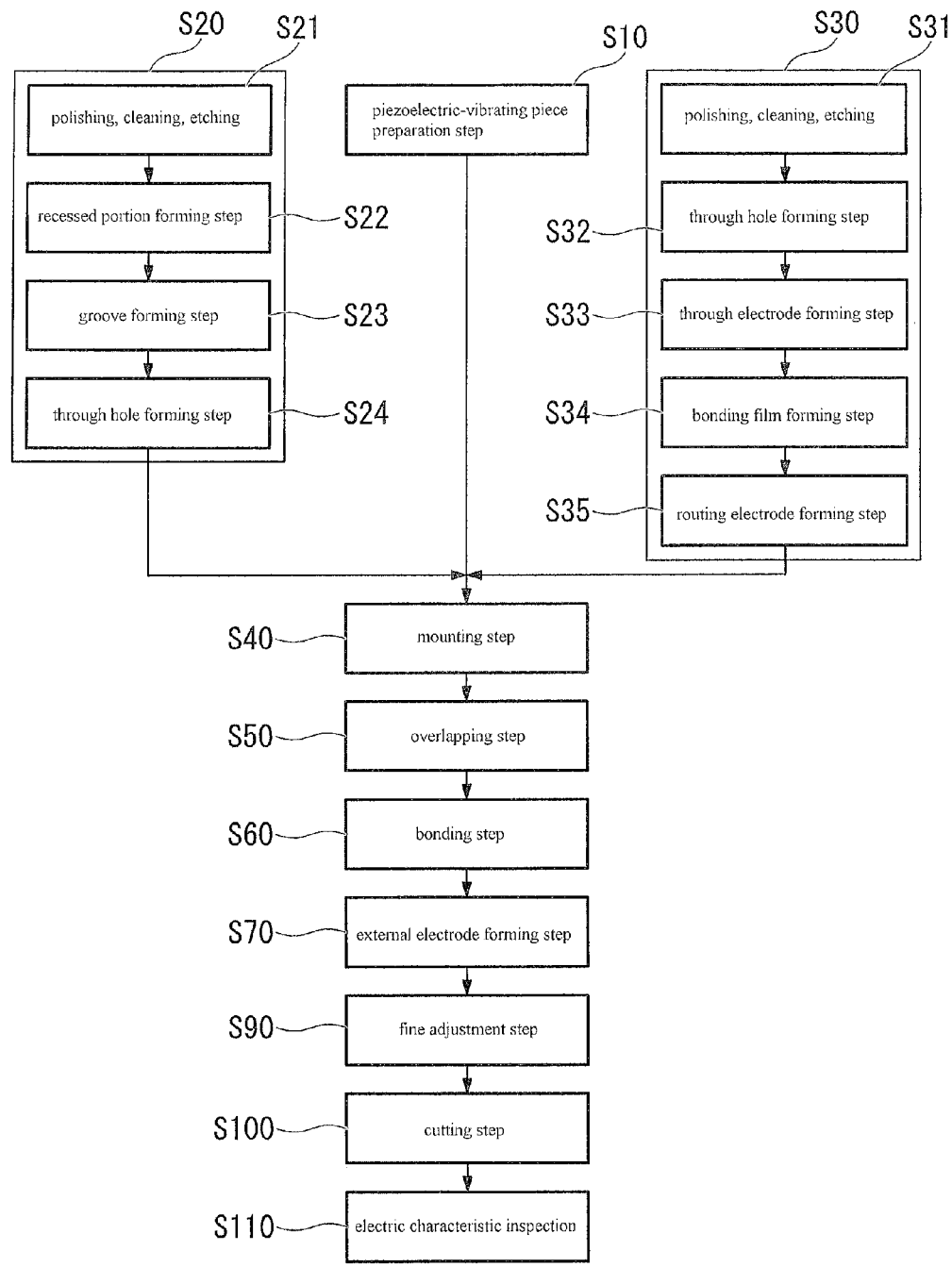
FIG. 9 is a flowchart showing the flow of manufacturing steps of the piezoelectric vibrator shown in FIG. 1.

Next, a manufacturing method of a plurality of above-mentioned piezoelectric vibrators 1 at a time by making use of a base substrate forming wafer 40 and a lid substrate forming wafer 50 is explained in conjunction with a flowchart shown in FIG. 9.

Firstly, the piezoelectric vibrating piece 4 shown in FIG. 6 to FIG. 8 is prepared by performing a piezoelectric-vibrating piece preparation step (S10).

To be more specific, a wafer having a predetermined thickness is firstly formed by slicing Lambert crystal ore at a predetermined angle.

Next, the wafer is subjected to rough working by lapping and, thereafter, a layer of the wafer degenerated by working is removed by etching. Then, the wafer is subjected to mirror-polish working such as polishing so that a wafer having a predetermined thickness is formed.

Subsequently, proper treatment such as cleaning is applied to the wafer and, thereafter, the wafer is formed by patterning using a photolithography technique in accordance with outer shapes of a plurality of piezoelectric vibrating pieces 4, and a metal film is also formed and is patterned thus forming the excitation electrodes 13, the lead electrodes 16, the mount electrodes 14, and the weight metal films 17.

A plurality of piezoelectric vibrating pieces 4 are prepared by the above-mentioned step.

After preparing the piezoelectric vibrating pieces 4, the coarse adjustment of resonance frequency is performed.

The coarse adjustment of resonance frequency is performed by changing a weight of the piezoelectric vibrating piece 4 in such a manner that a laser beam is irradiated to the coarse adjustment film 17a of the weight metal film 17 so as to evaporate the coarse adjustment film 17a partially.

Due to such an operation, it is possible to make the frequency fall within a range slightly larger than target nominal frequency.

The fine adjustment of the resonance frequency which adjusts the resonance frequency more accurately and sets the frequency within a range of the nominal frequency in the end is performed after mounting of the piezoelectric vibrating pieces 4. This fine adjustment is explained later.

Next, a first wafer preparation step is performed (S20). In this step, a lid substrate forming wafer 50 which becomes the lid substrate 3 later is prepared up to a state immediately before anodic bonding.

Figure 10:
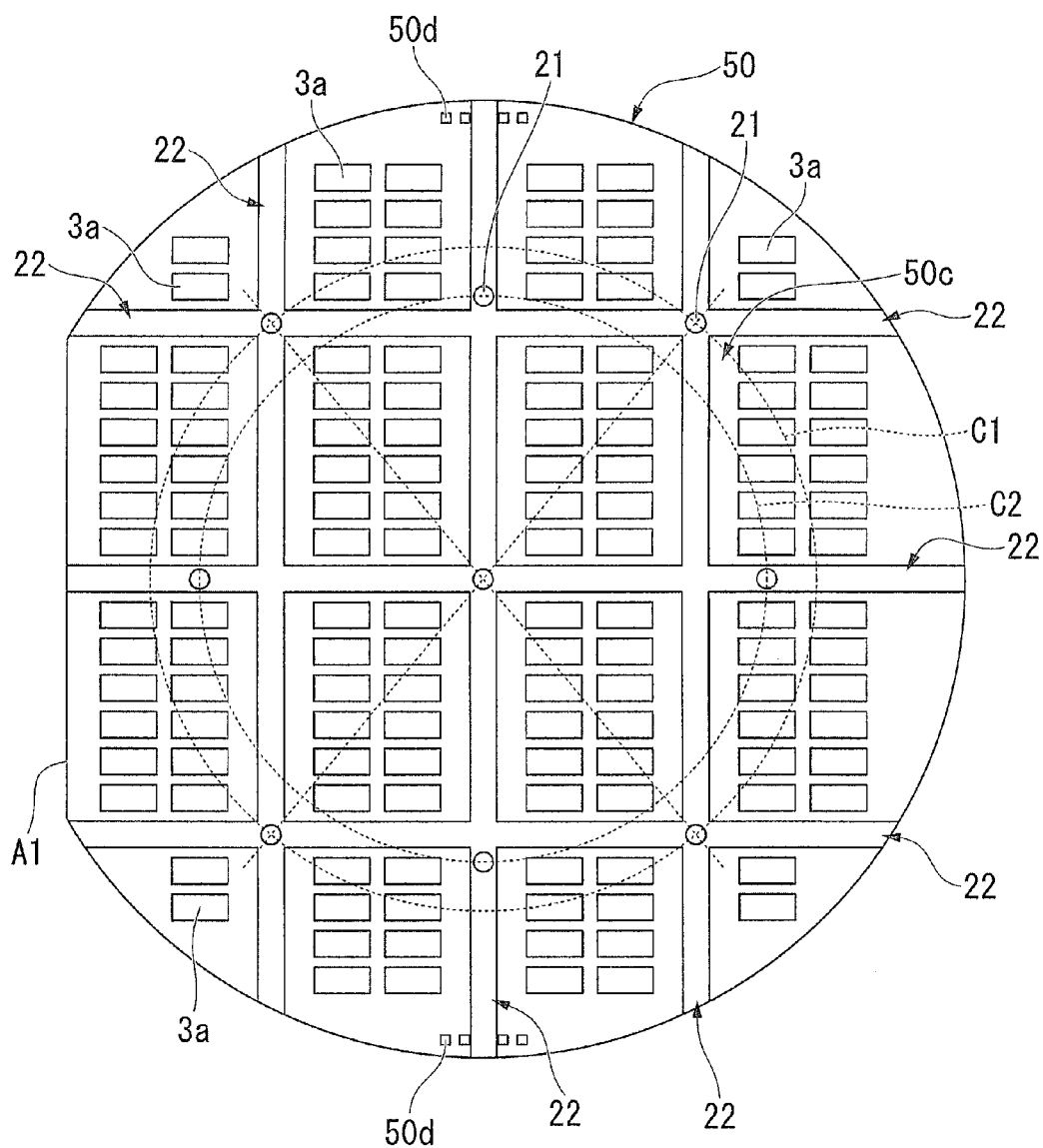
FIG. 10 is a view showing one step in manufacturing the piezoelectric vibrator along the flowchart shown in FIG. 9 and is also a view showing one embodiment where recessed portions are formed on a lid substrate forming wafer from which a lid substrate is produced.

Firstly, soda-lime glass is polished to a predetermined thickness and is cleaned and, thereafter, as shown in FIG. 10, a layer degenerated by working which forms an outermost surface is removed by etching or the like thus forming a disc-shaped lid substrate forming wafer 50 (S21).

In the example shown in the drawings, the lid substrate forming wafer 50 is formed into a circular shape as viewed in a plan view and, at the same time, a reference mark portion A1 is formed on an outer peripheral portion of the wafer 50 by cutting away the outer peripheral portion along a straight line (chord) which connects two points on an outer periphery of the wafer 50.

Next, a recessed portion forming step where a large number of recessed portions 3a for cavities C are formed on a bonding surface of the lid substrate forming wafer 50 is performed (S22) and, at the same time, a groove forming step where grooves 22 are formed (S23) and a through hole forming step where the through holes 21 are formed (S24) are performed.

The recessed portions 3a are formed on a portion 50c of the bonding surface of the lid substrate forming wafer 50 which is positioned more inside in the radial direction than an outer peripheral portion 50b (hereinafter, the portion 50c being referred to as a product region).

The plurality of recessed portions 3a are formed on the product region 50c at intervals in one direction, and are also formed at intervals in the other direction perpendicular to one direction.

In the example shown in the drawings, the recessed portions 3a are formed over the substantially whole region of the bonding surface of the lid substrate forming wafer 50 except for the outer peripheral portion 50b.

The grooves 22 are formed in a grid shape on the bonding surface of the lid substrate forming wafer 50, for example, and are opened outwardly in the radial direction at a radial end portion (outer periphery) of the lid substrate forming wafer 50.

In this embodiment, the grooves 22 are formed such that two grooves 22 are radially formed on the bonding surface of the lid substrate forming wafer 50 equidistantly about the center of the wafer 50, and a plurality of grooves 22 are formed parallel to these two grooves 22 at predetermined intervals.

A width of the groove 22 is set smaller than a longitudinal length of the recessed portion 3a which is formed into a rectangular shape as viewed in a plan view.

The plurality of through holes 21 are formed in the grooves 22 in a state where the through holes 21 penetrate the lid substrate forming wafer 50 in the thickness direction (in the laminating direction described later).

In this embodiment, the through hole 21 is formed at a position of a lattice point arranged in the grid-like grooves 22 at the center of the wafer 50, at positions of lattice points arranged in the grid-shaped grooves 22 on the circumference C1 having a predetermined first radius, and at positions arranged in the grooves 22 on the circumference C2 having a radius smaller than the radius of the circumference C1.

In the outer peripheral portion 50b of the lid substrate forming wafer 50, at respective positions which are arranged opposite to each other with the center of the wafer 50 sandwiched therebetween in the radial direction, positioning holes 50d in which a positioning pin of an anodic bonding device 30 described later is inserted are formed.

In this step, the recessed portions 3a, the grooves 22 and the through holes 21 may be formed simultaneously by etching the lid substrate forming wafer 50.

The recessed portions 3a, the grooves 22 and the through holes 21 may be simultaneously formed by pressing the lid substrate forming wafer 50 from above and below while heating the lid substrate forming wafer 50 by making use of jigs.

The recessed portions 3a, the grooves 22, and the through holes 21 may be also formed simultaneously by applying a glass paste to desired portions on the lid substrate forming wafer 50 by screen printing.

Any one of the above-mentioned methods may be used.

The first wafer preparation step is finished at this point of time.

Next, simultaneously with the above-mentioned step or at timing before and after the above-mentioned step, a second wafer preparation step is performed (S30). In this step, a base substrate forming wafer 40 which becomes the base substrate 2 later is prepared up to a state immediately before the base substrate 2 is bonded to the lid substrate 3 by anodic bonding.

Firstly, soda-lime glass is polished to a predetermined thickness and is cleaned and, thereafter, a layer degenerated by working which forms an outermost surface is removed by etching or the like thus forming a disc-shaped base substrate forming wafer 40 (S31).

Figure 13:
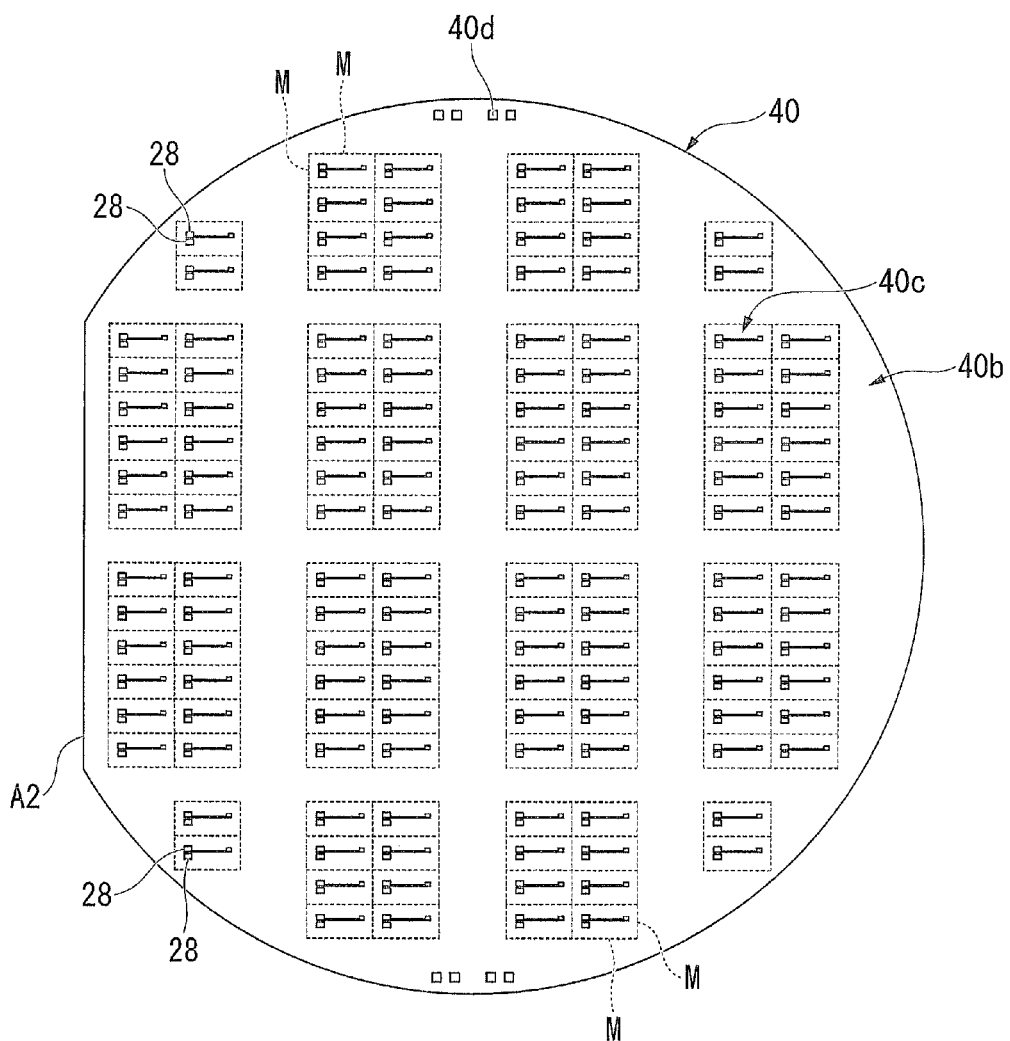
FIG. 13 is a view showing the whole base substrate forming wafer in a state shown in FIG. 12.

The base substrate forming wafer 40 is, as shown in FIG. 13, formed into a circular shape as viewed in a plan view and, at the same time, a reference mark portion A2 is formed on an outer peripheral portion of the wafer 40 by cutting away the outer peripheral portion along a straight line (chord) which connects two points on an outer periphery of the wafer 40.

In the outer peripheral portion 40b of the base substrate forming wafer 40, at respective positions which are arranged opposite to each other with the center of the wafer 40 sandwiched therebetween in the radial direction, positioning holes 40d in which a positioning pin of an anodic bonding device 30 described later is inserted are formed.

Figure 11:
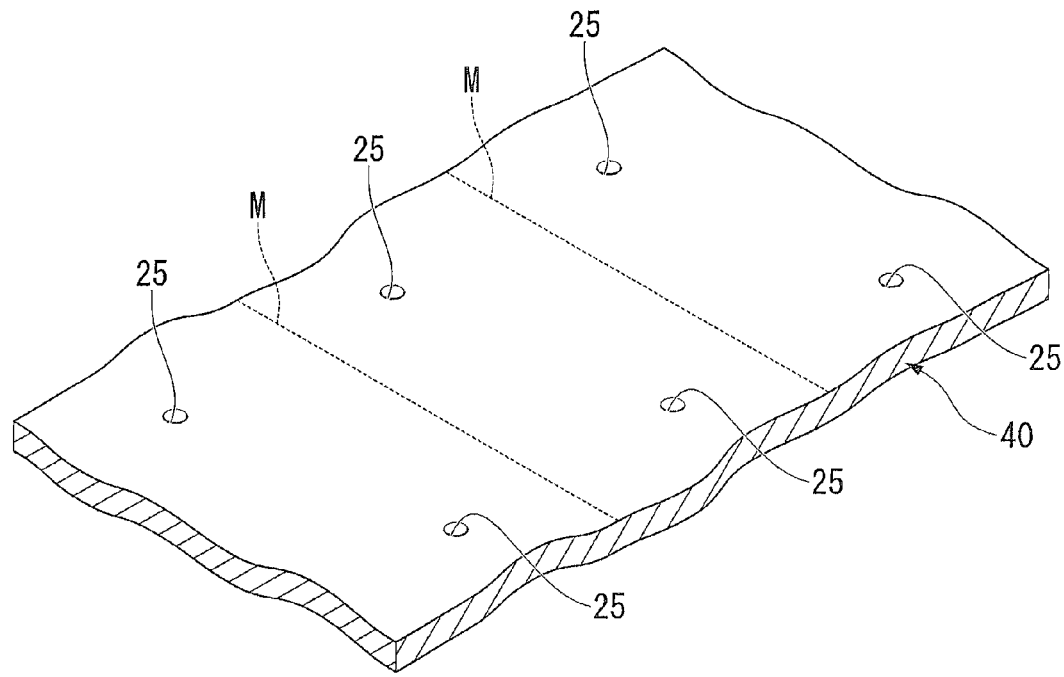
FIG. 11 is a view showing one step in manufacturing the piezoelectric vibrator along the flowchart shown in FIG. 9, and is also a view showing a state where one pair of through holes is formed in a base substrate forming wafer from which a base substrate is produced.

Next, as shown in FIG. 11, a through hole forming step is performed (S32). In this step, plural pairs of through holes 25 which penetrate the base substrate forming wafer 40 are formed.

Here, a dotted line M shown in FIG. 11 indicates a cutting line along which the wafer bonded body 60 is cut in a cutting step performed later. The through holes 25 are formed by a method such as a sandblast method, a press forming method using a jig or the like, for example.

The pair of through holes 25 is formed in the base substrate forming wafer 40 at positions where the pair of through holes 25 is arranged within each recessed portion 3a formed on the lid substrate forming wafer 50 when both wafers 40, 50 are made to overlap each other later, and also one through hole 25 is arranged on a base portion 12 side of the piezoelectric vibrating piece 4 which is mounted on the wafer 40 later and the other through hole 25 is arranged on a distal end side of the vibrating arm portion 11.

In the example shown in the drawings, the pair of through holes 25 is, on the bonding surface of the base substrate forming wafer 40, formed in a portion 40c (hereinafter, referred to as a product region) which is positioned more inside in the radial direction than the outer peripheral portion 40b.

Here, the plural pairs of through holes 25 are formed in the product region 40c at intervals in one direction and are also formed at intervals in the other direction perpendicular to one direction.

In the example shown in the drawings, the plural pairs of through holes 25 are formed in the substantially whole region of the bonding surface of the base substrate forming wafer 40 except for the outer peripheral portion 40b.

Subsequently, a through electrode forming step is performed (S33). In this step, the pair of through electrodes 26 is formed by filling the pair of through holes 25 with a conductive body not shown in the drawing.

Figure 12:
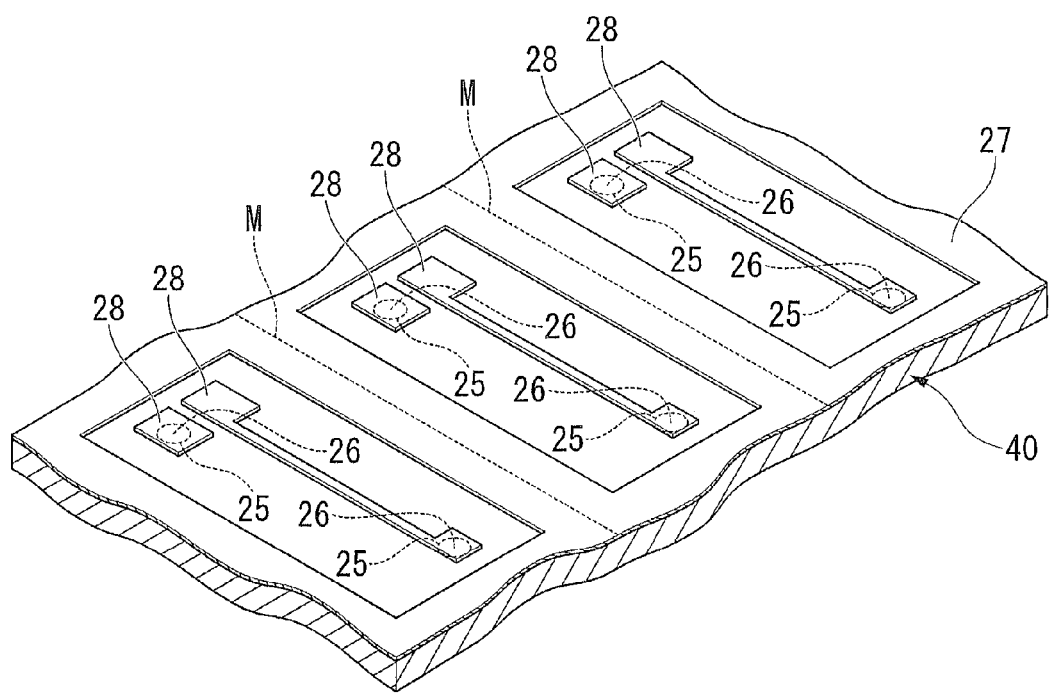
FIG. 12 is a view showing a state where through electrodes are formed in the pair of through hole and a bonding film and a routing electrode are formed by patterning on an upper surface of the base substrate forming wafer after a state shown in FIG. 11.

Then, as shown in FIG. 12 and FIG. 13, a bonding film forming step (S34) is performed. In this step, the bonding film 27 is formed on the bonding surface of the base substrate forming wafer 40 by patterning using a conductive material. At the same time, a routing electrode forming step is performed (S35). In this step, the plurality of routing electrodes 28 which are respectively electrically connected to the pair of through electrodes 26 are formed.

Due to the above-mentioned steps, one through electrode 26 and one routing electrode 28 are made conductive with each other and, at the same time, the other through electrode 26 and the other routing electrode 28 are made conductive with each other.

The second wafer preparation step is finished at this point of time.

A dotted line M shown in FIG. 12 and FIG. 13 indicates a cutting line along which the wafer bonded body 60 is cut in a cutting step performed later. Further, in FIG. 13, the bonding film 27 is omitted.

In FIG. 9, the order of steps is set such that the routing electrode forming step (S35) is performed after the bonding film forming step (S34). However, opposite to such order of steps, the bonding film forming step (S34) may be performed after the routing electrode forming step (S35) or both steps may be simultaneously performed.

Even though any one of these orders of steps is selected, the same manner of operation and advantageous effects can be acquired.

Accordingly, the order of steps may be suitably changed when necessary.

Next, a mounting step is performed (S40). In this step, a plurality of prepared piezoelectric vibrating pieces 4 are respectively bonded to a surface of the base substrate forming wafer 40 by bump bonding via the routing electrodes 28.

Firstly, the bump B made of gold or the like is formed on the pair of routing electrodes 28 respectively. Then, the base portions 12 of the piezoelectric vibrating pieces 4 are mounted on the bumps B and, thereafter, the piezoelectric vibrating pieces 4 are pressed to the bumps B while heating the bumps B at a predetermined temperature.

Accordingly, the piezoelectric vibrating pieces 4 are mechanically supported on the bumps B and, at the same time, the mount electrodes 14 and the routing electrodes 28 are electrically connected to each other.

Accordingly, at this point of time, the pair of excitation electrodes 13 of the piezoelectric vibrating piece 4 is respectively made conductive with the pair of through electrodes 26.

Particularly, the piezoelectric vibrating piece 4 is bonded by bump bonding and hence, the piezoelectric vibrating piece 4 is supported in a floating state from the bonding surface of the base substrate forming wafer 40.

Next, the base substrate forming wafer 40 and the lid substrate forming wafer 50 are set in the anodic bonding device 30.

Figure 14:
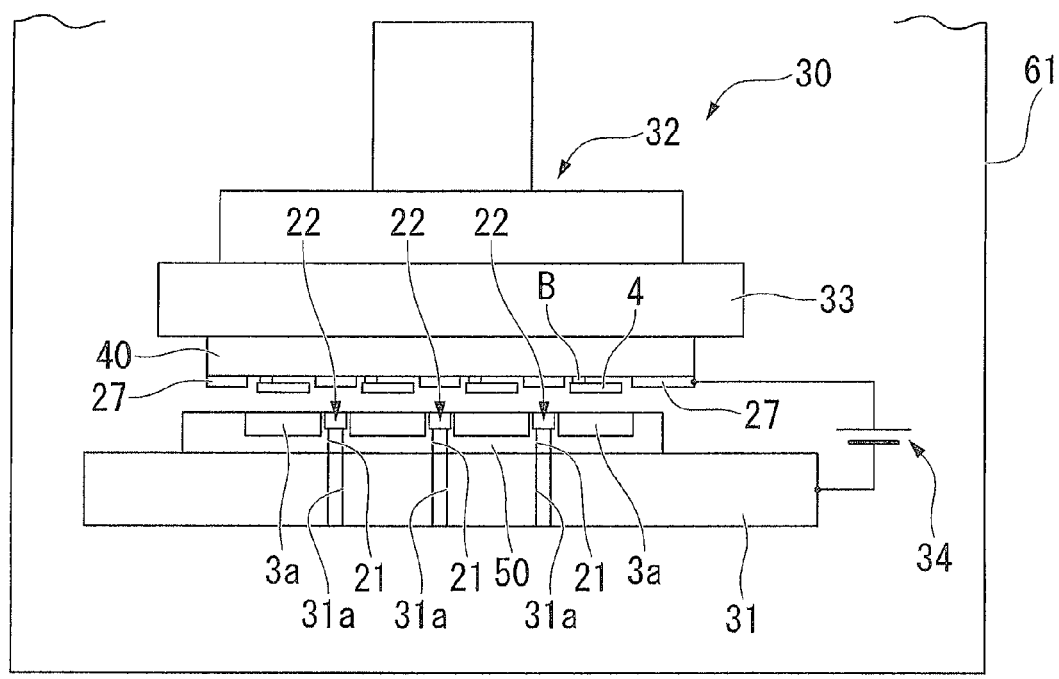
FIG. 14 is a schematic view showing a state where the base substrate forming wafer and the lid substrate forming wafer according to the embodiment of the present invention are set on an anodic bonding device.

As shown in FIG. 14, the anodic bonding device 30 includes a lower jig 31 made of a conductive material, an upper jig 33 which is supported by a pressurizing means 32 in a state where the upper jig 33 can be advanced or retracted with respect to the lower jig 31, and an energizing means 34 which electrically connects the bonding film 27 formed on the base substrate forming wafer 40 which is set on the upper jig 33 and the lower jig 31 to each other. The anodic bonding device 30 is arranged in a vacuum chamber 61.

The lid substrate forming wafer 50 is set on the lower jig 31 in a state where the recessed portions 3a are opened toward the upper jig 33, and the base substrate forming wafer 40 is set on the upper jig 33 in a state where the piezoelectric vibrating pieces 4 are made to face the recessed portions 3a formed on the lid substrate forming wafer 50 in an opposed manner.

While using the reference mark portions A1, A2 which are formed on the base substrate forming wafer 40 and the lid substrate forming wafer 50 respectively as indexes, positioning pins not shown in the drawings which are formed on the anodic bonding device 30 are inserted into the positioning holes 40d, 50d formed in the respective wafers 40, 50 so that the respective wafers 40, 50 are aligned with each other in the surface direction of the respective wafers 40, 50.

Further, the lower jig 31 on which the lid substrate forming wafer 50 is set includes communication holes 31a by which the through holes 21 formed in the lid substrate forming wafer 50 and the inside of the vacuum chamber 61 communicate with each other and hence, the through holes 21 and the communication holes 31a communicate with each other in a state where the respective wafers 40, 50 are aligned with each other.

Thereafter, an overlapping step is performed (S50). In this step, the upper jig 33 is forwardly moved toward the lower jig 31 by driving the pressurizing means 32 so that the piezoelectric vibrating pieces 4 mounted on the base substrate forming wafer 40 enter the inside of the recessed portions 3a of the lid substrate forming wafer 50, the base substrate forming wafer 40 and the lid substrate forming wafer 50 are laminated in a state where the respective wafers are sandwiched between the upper jig 33 and the lower jig 31 from both sides in the laminating direction (that is, the moving direction of the upper jig 33) whereby these wafers 40, 50 are made to overlap each other.

Due to such a step, the piezoelectric vibrating pieces 4 mounted on the base substrate forming wafer 40 are respectively housed in the cavities C formed between both wafers 40, 50.

Next, a bonding step is performed (S60). In this step, the base substrate forming wafer 40 and the lid substrate forming wafer 50 are bonded to each other by anodic bonding by applying a predetermined voltage under a predetermined temperature.

To be more specific, a predetermined voltage is applied between the bonding film 27 of the base substrate forming wafer 40 and the lower jig 31 by the energizing means 34.

As a result, an electrochemical reaction is generated on an interface between the bonding film 27 and the bonding surface of the lid substrate forming wafer 50 so that both the bonding film 27 and the bonding surface of the lid substrate forming wafer 50 are strongly bonded to each other by anodic bonding.

Figure 15:
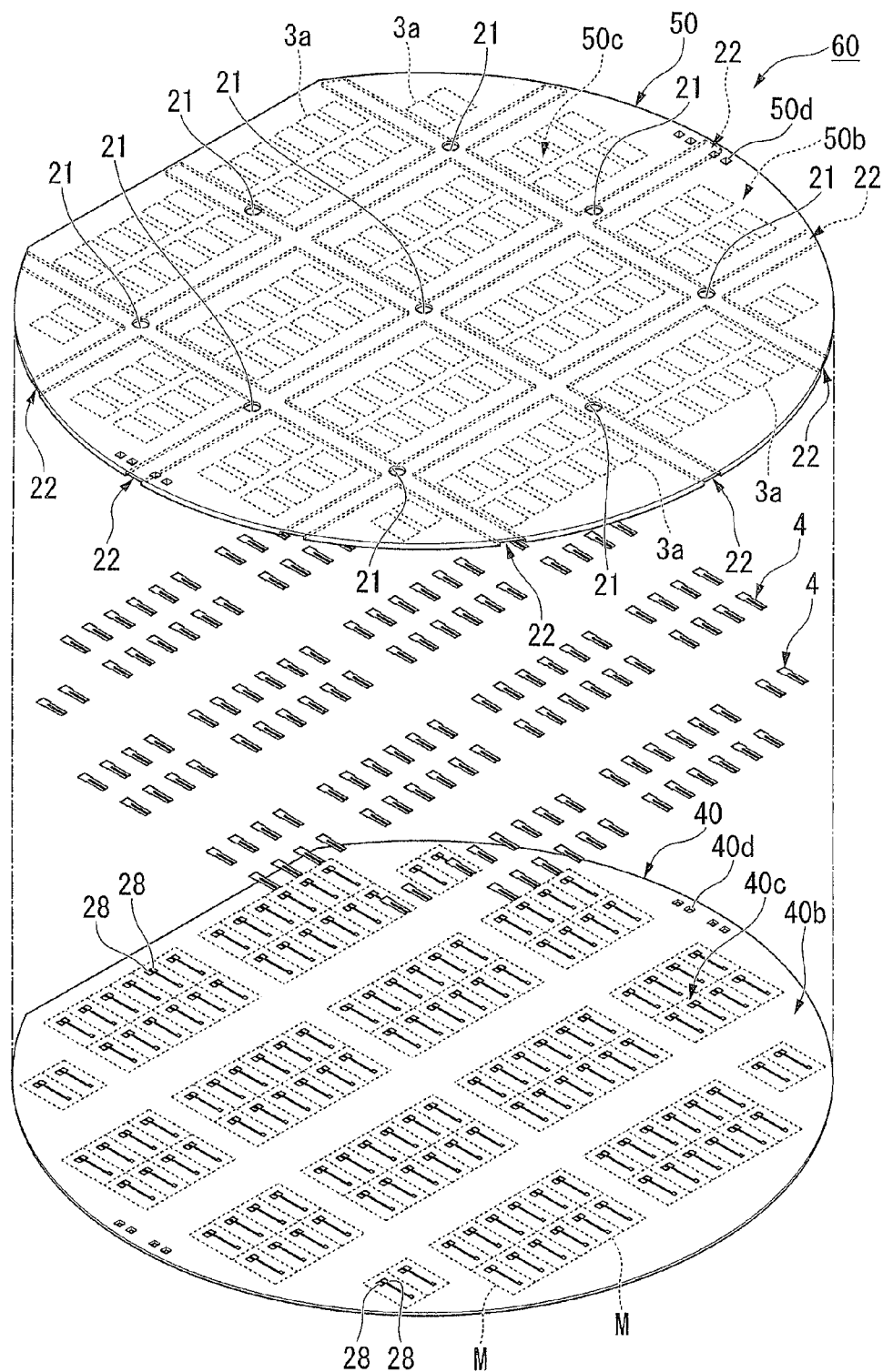
FIG. 15 is a view showing one step in manufacturing the piezoelectric vibrator along the flowchart shown in FIG. 9, and is also an exploded perspective view of a wafer bonded body which is formed by bonding the base substrate forming wafer and the lid substrate forming wafer by anodic bonding in a state where the piezoelectric vibrating piece is housed in a cavity.

Accordingly, the piezoelectric vibrating pieces 4 can be sealed in the cavities C and hence, it is possible to obtain a wafer bonded body 60 shown in FIG. 15 where the base substrate forming wafer 40 and the lid substrate forming wafer 50 are bonded to each other.

In FIG. 15, to facilitate the understanding of the drawing, the wafer bonded body 60 is shown in an exploded manner, and the bonding film 27 is omitted from the base substrate forming wafer 40 in the drawing. A dotted line M shown in FIG. 15 indicates a cutting line along which the wafer bonded body 60 is cut in a cutting step performed later.

In performing the anodic bonding, the through holes 25 which are formed in the base substrate forming wafer 40 are completely closed by the through electrodes 26 and hence, there exists no possibility that the air-tightness in the cavity C is deteriorated through the through holes 25.

Even in a case where a gas (for example, an oxygen gas or the like) is generated between the base substrate forming wafer 40 and the lid substrate forming wafer 50 at the time of anodic bonding of the base substrate forming wafer 40 and the lid substrate forming wafer 50, the gas can be discharged into the inside of the vacuum chamber 61 from between the base substrate forming wafer 40 and the lid substrate forming wafer 50 through the through holes 21 formed in the grooves 22 and the communication holes 31a which communicate with the through holes 21 and the inside of the vacuum chamber 61 thus ensuring the desired degree of vacuum in the cavities C.

After the above-mentioned anodic bonding is finished, an external electrode forming step is performed (S70). In this step, on a surface of the base substrate forming wafer 40 on a side opposite to the bonding surface of the base substrate forming wafer 40 to which the lid substrate forming wafer 50 is bonded, a plural pairs of external electrodes 29 each of which is respectively electrically connected to each pair of through electrodes 26 are formed by patterning using a conductive material.

Due to such a step, it is possible to operate the piezoelectric vibrating pieces 4 sealed in the cavities C by making use of the external electrodes 29.

Next, a fine adjustment step is performed (S90). In this step, frequency of the individual piezoelectric vibrating piece 4 sealed in the cavity C is finely adjusted in the form of the wafer bonded body 60 such that the frequency falls within a predetermined range.

To be more specific, a voltage is applied to the external electrodes 29 thus vibrating the piezoelectric vibrating piece 4.

Then, a laser beam is irradiated from the outside through the lid substrate forming wafer 50 while measuring frequency thus evaporating the fine adjustment 17b of the weight metal film 17.

Accordingly, a weight of a distal end side of the pair of vibrating arm portions 10, 11 is changed and hence, it is possible to perform the fine adjustment such that the frequency of the piezoelectric vibrating piece 4 falls within a predetermined range of nominal frequency.

After the fine adjustment of frequency is finished, a cutting step is performed (S100). In this step, the wafer bonded body 60 formed by bonding the base substrate forming wafer 40 and the lid substrate forming wafer 50 is cut into small pieces along the cutting lines M shown in FIG. 15.

As a result, it is possible to manufacture a plurality of surface-package-type piezoelectric vibrators 1 shown in FIG. 1 each of which houses the piezoelectric vibrating piece 4 in the cavity C formed between the base substrate 2 and the lid substrate 3 which are bonded to each other by anodic bonding at a time.

It may be possible to change the order of steps such that the fine adjustment step (S90) is performed after cutting the wafer bonded body 60 into individual piezoelectric vibrators 1 by performing the cutting step (S100).

However, as described above, by performing the fine adjustment step (S90) prior to the cutting step (S100), the fine adjustment can be performed in the form of the wafer bonded body 60 and hence, it is possible to perform the fine adjustment of the plurality of piezoelectric vibrators 1 more efficiently.

Accordingly, this order of steps is preferable in view of the enhancement of the throughput.

Thereafter, an electric characteristic inspection of the inside of the piezoelectric vibrating piece 4 is performed (S110).

That is, resonance frequency, a resonance resistance value, a drive level characteristic (dependency of resonance frequency and resonance resistance value on excitation power) and the like of the piezoelectric vibrating piece 4 are checked by measuring.

Further, the insulation resistance characteristics and the like are also checked. Finally, an appearance inspection of the piezoelectric vibrator 1 is performed, and a size, quality and the like of the piezoelectric vibrator 1 are finally checked.

The manufacture of the piezoelectric vibrator 1 is finished with this step.

As has been explained heretofore, according to the manufacturing method of the package of this embodiment, the through holes 21 are formed in the lid substrate forming wafer 50 and hence, an oxygen gas generated between both wafers 40, 50 in performing the previously-mentioned bonding step can be easily discharged to the outside from between both wafers 40, 50 through the through holes 21 and the communication holes 31*a* whereby it is possible to suppress the manufacture of the piezoelectric vibrators 1 which exhibit the low degree of vacuum in the cavity C.

Further, by concentrating strain generated in the lid substrate forming wafer 50 in the course of the bonding step in the through holes 21, it is possible to positively deform the through holes 21.

Accordingly, a state where the product regions 40*c*, 50*c* of both wafers 40, 50 are brought into contact with each other over the substantially whole region except for the through holes 21 and the recessed portions 3*a* can be maintained and hence, the product regions 40*c*, 50*c* can be surely bonded to each other over the substantially whole region.

Further, the through holes 21 are formed in the lid substrate forming wafer 50 which includes the recessed portions 3*a*. Accordingly, the through holes 21 can be simultaneously formed with the formation of the recessed portions 3*a* by press forming, etching or the like and hence, the wafer 50 can be formed efficiently.

Further, in this embodiment, the through hole 21 is formed at the center of the lid substrate forming wafer 50 and hence, the through hole 21 can be more surely deformed by strain generated in the lid substrate forming wafer 50 in the course of the bonding step whereby the product regions 40*c*, 50*c* of both wafers 40, 50 can be more surely bonded to each other over the approximately whole region.

Further, the through hole 21 is formed at the center where an oxygen gas generated between these wafers 40, 50 at the time of bonding both wafers 40, 50 is liable to stay and hence, the piezoelectric vibrators 1 are not manufactured from such center whereby it is possible to surely suppress the manufacture of the piezoelectric vibrators 1 which exhibit the low degree of vacuum in the cavity C.

The technical scope of the present invention is not limited to the above-mentioned embodiment, and various modifications are conceivable without departing from the gist of the present invention.

Although the through holes 21 are formed in the lid substrate forming wafer 50 in the above-mentioned embodiment, the through holes 21 may be formed in the base substrate forming wafer 40. In this case, the communication holes which make the through holes formed in the base substrate forming wafer 40 and the inside of the vacuum chamber 61 communicate with each other may be formed in the upper jig 33.

Further, although a circular shape is exemplified as one example of the shape of the through holes 21, the shape of the through holes 21 is not limited to such a shape, and may be a polygonal shape, a slit shape which extends in the radial direction or the like.

The lid substrate forming wafer 50 includes the grooves 22 which extend in the radial direction and the through holes 21 are formed in the grooves 22 and hence, an oxygen gas generated between both wafers 40, 50 at the time of bonding can be surely discharged to the outside from between these wafers 40, 50.

Further, the grooves 22 open outwardly in the radial direction at the radial end portion of the lid substrate forming wafer 50 and hence, an oxygen gas generated between both wafers 40, 50 at the time of bonding can be easily discharged into the vacuum chamber 61.

By concentrating strain generated in the lid substrate forming wafer 50 in the course of the bonding step in the grooves 22 and the through holes 21, it is possible to positively deform the grooves 22 and the through holes 21.

Accordingly, it is possible to maintain a state where the product regions 40*c*, 50*c* of both wafers 40, 50 are brought into contact with each other over the whole region except for the groove 22, the through hole 21 and the recessed portion 3*a* and hence, the product regions 40*c*, 50*c* can be surely bonded to each other over the whole region.

In the above-mentioned constitution, it is preferable that the radial outer ends of the grooves 22 are positioned more inwardly in the radial direction than outer peripheries of the wafers 40, 50.

In this case, the lowering of strength of the wafers 40, 50 caused by the formation of the grooves 22 can be suppressed.

Further, in the above-mentioned constitution, it is preferable that the bonding film 27 is not formed on the portion which is positioned more outwardly in the radial direction than the radial outer end of the groove 22.

In this case, between both wafers 40, 50, the portion which is positioned between the radial outer end of the groove 22 and outer peripheries of the wafers 40, 50 is not bonded and hence, an oxygen gas can be surely discharged to the outside from between both wafers 40, 50 through a minute gap formed between both wafers 40, 50.

By setting a width of the groove 22 smaller than a length of the recessed portion 3*a* formed in a rectangular shape as viewed in a plan view in the longitudinal direction, for example, the product region where the recessed portion 3*a* can be formed in the lid substrate forming wafer 50 can be easily ensured widely and hence, the number of package products which can be formed at a time can be increased. That is, a yield ratio can be enhanced.

Further, in the above-mentioned embodiment, the piezoelectric vibrating piece 4 is bonded by bump bonding. However, the bonding of the piezoelectric vibrating piece 4 is not limited to the bump bonding. For example, the piezoelectric vibrating piece 4 may be bonded using a conductive adhesive agent.

However, by adopting bump bonding, the piezoelectric vibrating piece 4 can be floated from the base substrate 2 and hence, a minimum vibration gap necessary for vibrations can be naturally ensured.

From this point of view, bump bonding is desirable.

Further, in the above-mentioned embodiment, the piezoelectric vibrator 1 is exemplified as a package product. However, the package product is not limited to the piezoelectric vibrator 1, and may be suitably changed without being limited to the piezoelectric vibrator 1.

In addition to the above, the constitutional elements in the above-mentioned embodiments may be suitably exchanged with well-known constitutional elements or the above-mentioned modifications may be suitably combined with each other without departing from the gist of the present invention.

The through hole 21 and the communication hole 31*a* may have the same shape or the different shapes.

The through holes 21 may be formed in portions other than the grooves 22.

(Oscillator)

Figure 16:
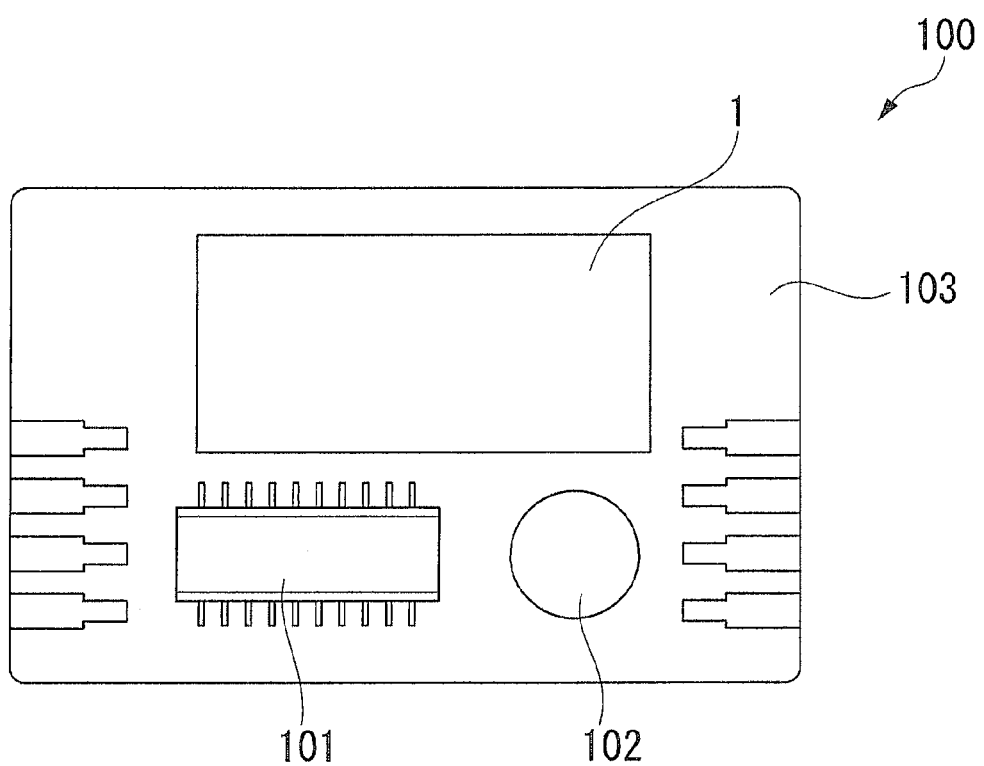
FIG. 16 is a constitutional view showing one embodiment of an oscillator according to the present invention.

Next, an oscillator according to one embodiment of the present invention is explained in conjunction with FIG. 16.

The oscillator 100 of this embodiment is, as shown in FIG. 16, formed as an oscillating element in which the piezoelectric vibrator 1 is electrically connected to an integrated circuit 101.

The oscillator 100 includes a substrate 103 on which an electronic part 102 such as a capacitor is mounted.

The above-mentioned integrated circuit 101 for oscillator is mounted on the substrate 103, and the piezoelectric vibrating element 4 of the piezoelectric vibrator 1 is mounted on the substrate 103 in the vicinity of the integrated circuit 101.

The electronic part 102, the integrated circuit 101 and the piezoelectric vibrator 1 are electrically connected with each other by a wiring pattern not shown in the drawing. The respective constitutional parts are molded by a resin not shown in the drawing.

In the oscillator 100 having such a constitution, when a voltage is applied to the piezoelectric vibrator 1, the piezoelectric vibrating piece 4 arranged in the piezoelectric vibrator 1 vibrates.

This vibration is converted into an electric signal due to a piezoelectric characteristic which the piezoelectric vibrating piece 4 possesses, and the electric signal is inputted to the integrated circuit 101.

Various processing are applied to the inputted electric signal by the integrated circuit 101, and a frequency signal is outputted from the integrated circuit 101. Accordingly, the piezoelectric vibrator 1 functions as an oscillating element.

Further, by selectively setting the constitution of the integrated circuit 101, for example, an RTC (real time clock) module or the like corresponding to a request, it is possible to impart, besides a function as a timepiece-use single-function oscillator or the like, a function of controlling an operation date and time of the oscillator or an external device or a function of providing time, calendar and the like to the oscillator 100.

According to the oscillator 100 of this embodiment, the oscillator 100 includes the high-quality piezoelectric vibrator 1 with the high operational reliability and hence, the oscillator 100 per se can acquire the high quality in the same manner as the piezoelectric vibrator 1.

(Electronic Apparatus)

Figure 17:
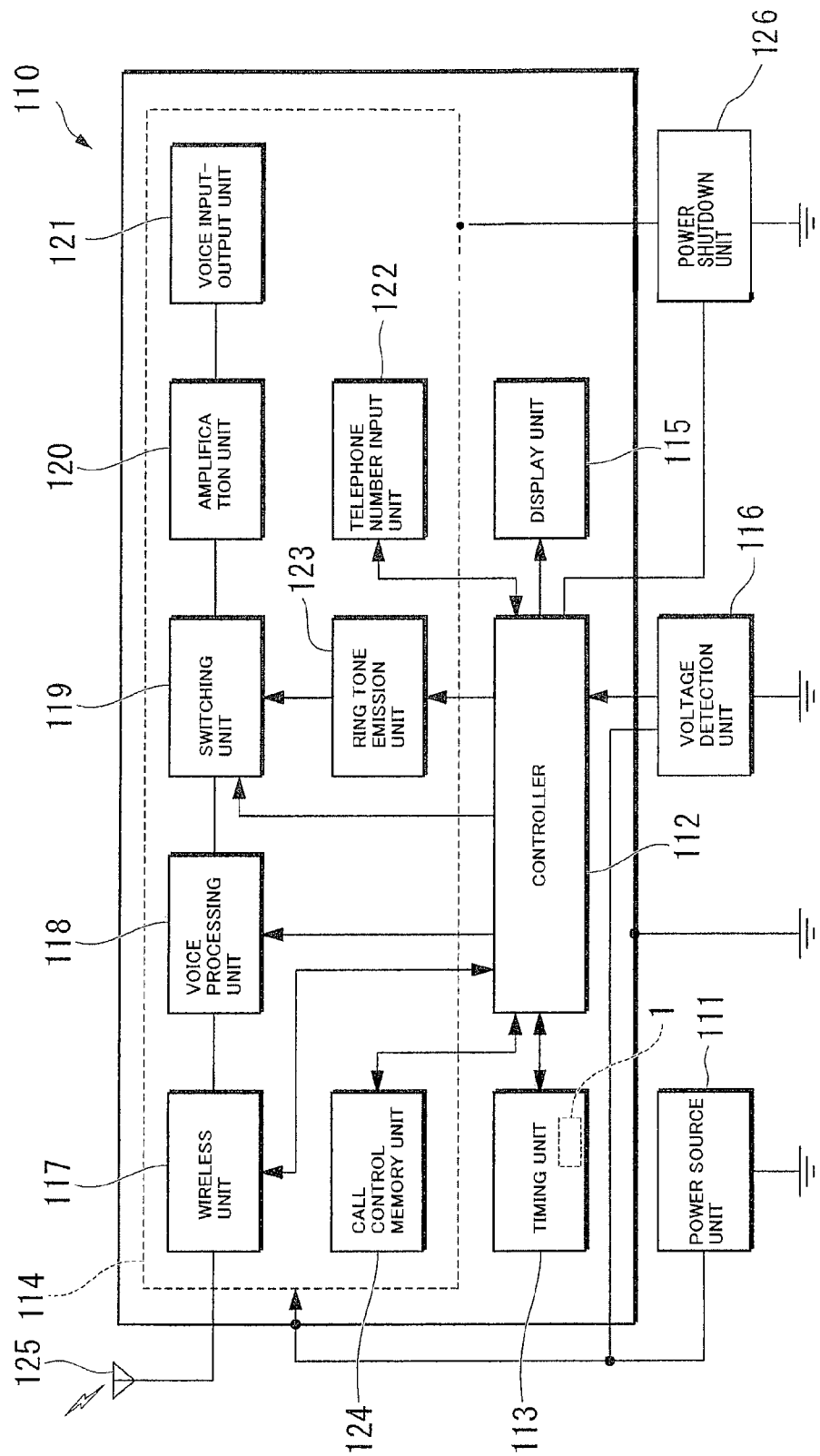
FIG. 17 is a constitutional view showing one embodiment of an electronic apparatus according to the present invention.

Next, the electronic apparatus according to one embodiment of the present invention is explained in conjunction with FIG. 17. The explanation is made with respect to an example where the electronic apparatus is a portable information device 110 which includes the above-mentioned piezoelectric vibrator 1.

Firstly, the portable information device 110 of this embodiment is a device which is represented by a mobile phone, for example, and is a developed or improved form of a wrist watch of the related art.

The portable information device 110 resembles the wrist watch in appearance. A liquid crystal display is arranged on a portion of the portable information device 110 which corresponds to a dial of the wrist watch, and a present time or the like can be displayed on a screen of the liquid crystal display.

Further, when the portable information device 110 is used as a communication device, a user removes the portable information device 110 from his wrist, and performs communication in the same manner as a mobile phone of the related art by a speaker and a microphone incorporated into an inner portion of a band. However, the portable information device 110 is remarkably miniaturized and light-weighted compared to the conventional mobile phone.

Next, the constitution of the portable information device 110 of this embodiment is explained. The portable information device 110 includes, as shown in FIG. 17, a piezoelectric vibrator 1 and a power source part 111 for power supply.

The power source part 111 is formed of a lithium secondary battery, for example.

To the power source part 111, a control part 112 which performs various controls, a timer part 113 which counts time or the like, a communication part 114 which performs communication with the outside, a display part 115 which displays various information, and a voltage detection part 116 which detects voltages of the respective functional parts are connected to each other in parallel.

Electricity is supplied to the respective functional parts from the power source part 111.

The control part 112 performs the transmission and the reception of voice data, the measurement, display and the like of a present time and an operational control of the whole system by controlling the respective functional parts. Further, the control part 112 includes a ROM in which programs are preliminarily written, a CPU which reads and executes the programs written in the ROM, a RAM which is used as a work area of the CPU and the like.

The timer part 113 includes an integrated circuit which incorporates an oscillation circuit, a register circuit, a counter circuit, an interface circuit and the like therein, and the piezoelectric vibrator 1.

When a voltage is applied to the piezoelectric vibrator 1, the piezoelectric vibrating piece 4 vibrates, the vibrations are converted into an electric signal due to a piezoelectric characteristic which crystal possesses, and the electric signal is inputted to the oscillation circuit.

An output of the oscillation circuit is binalized and the binalized value is counted by the register circuit and the counter circuit.

Then, the transmission/reception of signals is performed between the timer part 113 and the control part 112 via the interface circuit, and a present time, a present date, calendar information and the like are displayed on the display part 115.

The communication part 114 has the substantially same functions as a conventional mobile phone, and includes a wireless part 117, a voice processing part 118, a switching part 119, an amplifying part 120, a voice inputting/outputting part 121, a telephone number inputting part 122, an incoming call sound generation part 123, and a calling-control memory part 124.

The wireless part 117 performs the transmission/reception of various data such as voice data with a base station through an antenna 125. The voice processing part 118 performs coding and decoding of a voice signal inputted from the wireless part 117 or the amplifying part 120.

The amplifying part 120 amplifies a signal received from the voice processing part 118 or the voice inputting/outputting part 121 to a predetermined level. The voice inputting/outputting part 121 is formed of a speaker, a microphone or the like, and makes an incoming call sound or a received voice loud or collects voice.

Further, the incoming call sound generation part 123 generates an incoming call sound in response to calling from a base station. The switching part 119 switches the amplifying part 120 connected to the voice processing part 118 to the incoming call sound generation part 123 when a call arrives so that an incoming call sound generated by the incoming call sound generation part 123 is outputted to the voice inputting/outputting part 121 through the amplifying part 120.

Here, the calling control memory part 124 stores a program relating to an incoming/outgoing call control in communication. Further, the telephone number inputting part 122 includes, for example, numeral keys ranging from 0 to 9 and other keys. By pushing these numeral keys or the like, a user can input the telephone number of call destination or the like.

The voltage detection part 116, when a voltage applied to the respective functional parts such as the control part 112 from the power source part 111 becomes lower than a predetermined value, detects such lowering of voltage and notifies the lowering of voltage to the control part 112.

The predetermined voltage value at this point of time is a value which is preliminarily set as minimum voltage necessary for stably driving the communication part 114, and is set to approximately 3V, for example.

The control part 112 which receives the notification of the lowering of voltage from the voltage detection part 116 prohibits operations of the wireless part 117, the voice processing part 118, the switching part 119 and the incoming call sound generation part 123.

Particularly, the operation stop of the wireless part 117 which consumes large power is inevitable. Further, a message that a remaining battery quantity is short so that the communication part 114 is inoperable is displayed on the display part 115.

That is, due to the combined operation of the voltage detection part 116 and the control part 112, an operation of the communication part 114 can be prohibited and a message which indicates the prohibition of the operation of the communication part 114 can be displayed on the display part 115. This display may be formed of a character message. However, as a more intuitive display, a×(bad) mark may be attached to a telephone icon displayed on an upper part of a display screen of the display part 115.

The electronic apparatus is provided with a power source breaking part 126 which can selectively break a power source of a portion relating to a function of the communication part 114. In this case, it is possible to stop the function of the communication part 114 more reliably.

According to the portable information device 110 of this embodiment, the portable information device 110 includes the high-quality piezoelectric vibrator 1 with the high operational reliability and hence, the portable information device 110 per se can acquire the high quality in the same manner as the piezoelectric vibrator 1.

(Radio-Controlled Timepiece)

Figure 18:
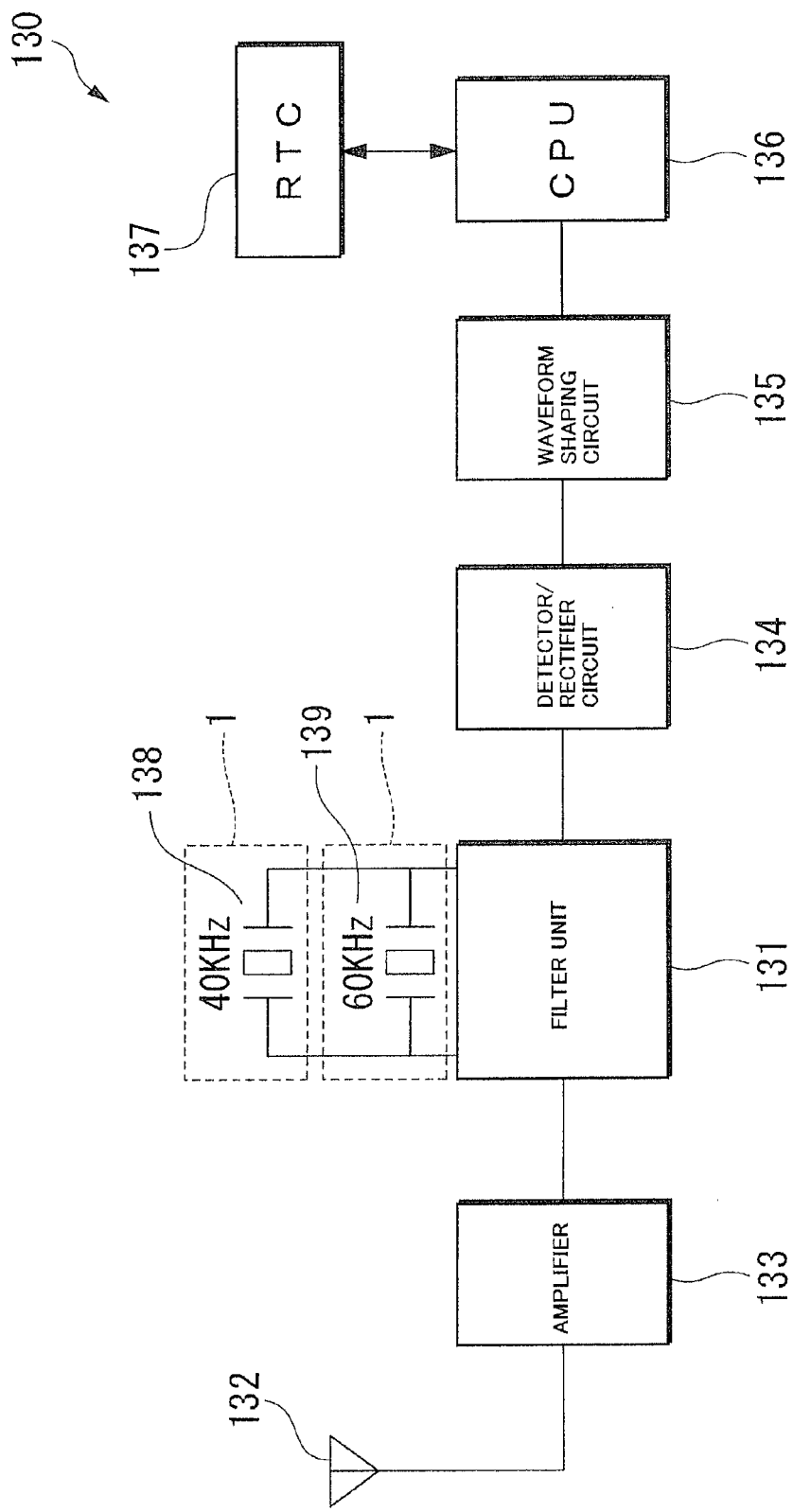
FIG. 18 is a constitutional view showing one embodiment of a radio-controlled timepiece according to the present invention.

Next, the radio-controlled timepiece according to one embodiment of the present invention is explained in conjunction with FIG. 18.

The radio-controlled timepiece 130 of this embodiment is, as shown in FIG. 18, a timepiece which includes the piezoelectric vibrator 1 which is electrically connected to a filter part 131, and has a function of receiving a standard electric wave containing timepiece information, automatically correcting time to correct time, and displaying the corrected time.

In Japan, transmission installations (transmission stations) which transmit the standard electric wave are located in Fukushima prefecture (40 kHz) and Saga prefecture (60 kHz) and transmit the standard electric waves respectively. A long wave having frequency of 40 kHz or 60 kHz has both of property that the wave propagates on a ground and property that the wave propagates while being reflected between an ionosphere and a ground and hence, the long wave has a wide propagation range whereby the standard electric wave can cover all areas of Japan with the above-mentioned two transmission installations.

The functional constitution of the radio-controlled timepiece 130 is explained in detail hereinafter.

The antenna 132 receives the standard electric wave formed of a long wave having frequency of 40 kHz or 60 kHz. The standard electric wave formed of a long wave is an electric wave which is obtained by AM-modulating a carrier wave having frequency of 40 kHz or 60 kHz by time information called as a time code. The received standard electric wave formed of a long wave is amplified by an amplifier 133, and is filtered by a filter part 131 having a plurality of piezoelectric vibrators 1, and is tuned.

The piezoelectric vibrators 1 of this embodiment include crystal vibrator parts 138, 139 having resonance frequency of 40 kHz or 60 kHz as same as the above-mentioned frequency of the carrier wave respectively.

Further, a filtered signal of predetermined frequency is detected and demodulated by a detection/rectifying circuit 134. Subsequently, the time code is taken out through a waveform shaping circuit 135, and is counted by a CPU 136. The CPU 136 reads information on present year, cumulative days, day of week, time and the like. The read information is reflected on an RTC 137 so that correct time information is displayed.

The carrier wave has frequency of 40 kHz or 60 kHz and hence, the crystal vibrator parts 138, 139 are preferably formed of a vibrator having the above-mentioned tuning-fork structure.

Although the above-mentioned explanation is made with respect to the radio-controlled timepiece used in Japan, the frequencies of standard electric waves of long wave used overseas differ from the standard electric wave used in Japan. For example, the standard electric wave having frequency of 77.5 kHz is used in Germany. Accordingly, in incorporating the radio-controlled timepiece 130 also compatible with the oversea use into a portable device, the piezoelectric vibrator 1 having frequency different from the frequency used in Japan becomes necessary.

According to the radio-controlled timepiece 130 of this embodiment, the radio-controlled timepiece 130 includes the high-quality piezoelectric vibrator 1 with high operational reliability and hence, the radio-controlled timepiece 130 per se can acquire the high quality in the same manner as the piezoelectric vibrator 1.

The technical scope of the present invention is not limited to the above-mentioned embodiments, and the various modifications and variations are conceivable without departing from the gist of the present invention.

For example, in the above-mentioned embodiment, the explanation has been made by taking the piezoelectric vibrator 1 where the piezoelectric vibrating piece 4 is sealed in the package 9 as an electronic part as an example. However, the present invention is not limited to the piezoelectric vibrator 1 and is applicable to a device other than the piezoelectric vibrator which seals an electronic part other than the piezoelectric vibrating piece 4 therein.

Further, when the piezoelectric vibrating piece 4 is sealed in the package as an electronic part, the piezoelectric vibrating piece 4 is not limited to a tuning-fork-type piezoelectric vibrating piece, and may be a thickness-shear piece-type vibrating piece formed by AT cutting.

Further, with respect to the case where the tuning-fork-type piezoelectric vibrating piece 4 is adopted, in the above-mentioned embodiment, the explanation has been made by taking the groove-type piezoelectric vibrating piece 4 where the groove portions 18 are formed on both main surfaces of the vibrating arm portions 10, 11 as an example. However, it is also possible to adopt a type of piezoelectric vibrating piece having no grooves.

However, electric field efficiency between the excitation electrodes at the time of applying a voltage can be increased by forming the groove portions and hence, a vibration loss can be further suppressed and thereby the vibration characteristic is further improved. That is, a CI value (Crystal Impedance) can be further lowered and hence, the piezoelectric vibrating piece can acquire the higher performance. It is desirable to form the groove portions from this viewpoint.

What is claimed is:
1. A manufacturing method for a package that includes an electronic part therein, the method comprising:

providing a lid substrate and a base substrate, wherein at least one of the base substrate and the lid substrate has a through hole that penetrates the respective substrate in a thickness direction perpendicular to a plane of the substrates;

providing a jig arranged inside a vacuum chamber, the jig having a communication hole therein;

using the jig to laminate the lid substrate to the base substrate and thereby form a plurality of cavities each of which includes the electronic part sealed therein, wherein the base substrate and the lid substrate are anodically bonded in a state where the base substrate and the lid substrate are pressurized in the thickness direction to form a bonded body and the through hole and the communication hole are aligned with each other inside the vacuum chamber, such that gas within the cavities can escape through the through hole and the communication hole at the time of forming the bonded body by the anodic bonding; and forming a plurality of packages by cutting the bonded body for every one of the plurality of cavities.

2. The manufacturing method according to claim 1, wherein providing a base substrate further comprises attaching a plurality of the electronic parts to the base substrate arrayed in product regions across the base substrate.

3. The manufacturing method according to claim 2, wherein attaching a plurality of electronic parts comprises attaching a plurality of piezoelectric vibrating pieces.

4. The manufacturing method according to claim 2, wherein attaching a plurality of electronic parts comprises bump bonding.

5. The manufacturing method according to claim 1, wherein providing a lid substrate further comprises forming a plurality of grooves indented in a surface of the lid substrate that define product regions thereon.

6. The manufacturing method according to claim 5, wherein the plurality of grooves are formed in the surface such that the grooves extend to the periphery of the lid substrate.

7. The manufacturing method according to claim 6 further comprising forming a bonding film on the base substrate, wherein the bonding film is confined to regions of the base substrate that do not align with the grooves at the periphery of the lid substrate.

8. The manufacturing method according to claim 5, wherein at least one through hole resides in a geometric center of the lid substrate.

9. The manufacturing method according to claim 5 further comprising forming through holes in the plurality of grooves.

10. The manufacturing method according to claim 5 wherein at least some of the through holes are formed in intersection points of the plurality of grooves.

11. The manufacturing method according to claim 5 further comprising forming recessed portions in the lid substrate that align with the product regions of the base substrate when the lid substrate and the base substrate are anodically bonded, wherein the recessed portions and the plurality of grooves are simultaneously formed.

12. The manufacturing method according to claim 1, wherein a gas generated between the lid substrate and the base substrate during anodically bonding the lid substrate and the base substrate is evacuated through the through hole and the communication hole.

* * * * *